(12) United States Patent
Koyama

(10) Patent No.: US 9,117,713 B2
(45) Date of Patent: Aug. 25, 2015

(54) SEMICONDUCTOR DEVICE COMPRISING A GATE OF AN AMPLIFIER TRANSISTOR UNDER AN INSULATING LAYER AND A TRANSFER TRANSISTOR CHANNEL OVER THE INSULATING LAYER THE AMPLIFIER TRANSISTOR AND TRANSFER TRANSISTOR OVERLAPPING

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 628 days.

(21) Appl. No.: 12/938,399

(22) Filed: Nov. 3, 2010

(65) Prior Publication Data

US 2011/0108706 A1 May 12, 2011

(30) Foreign Application Priority Data

Nov. 6, 2009 (JP) .................................. 2009-255253

(51) Int. Cl.
*H01J 40/14* (2006.01)
*H01L 27/00* (2006.01)
(Continued)

(52) U.S. Cl.
CPC .... *H01L 27/14616* (2013.01); *H01L 27/14612* (2013.01); *H01L 27/14632* (2013.01);
(Continued)

(58) Field of Classification Search
CPC .................. H01L 27/14616; H01L 27/14632; H01L 27/1225; H01L 27/1203; H01L 27/14627; H01L 27/14643; H01L 27/14612; H04N 5/37457

USPC ........................ 250/208.1, 214 R, 214.1, 239; 257/290–292, 257, 258, 431, 443, 444, 257/448; 348/294, 297, 300, 301, 302, 308, 348/311
See application file for complete search history.

(56) References Cited

U.S. PATENT DOCUMENTS 4,593,320 A * 6/1986 Nishizawa et al. ............ 348/307
5,698,844 A   12/1997 Shinohara et al.
(Continued)

FOREIGN PATENT DOCUMENTS

EP   1737044 A   12/2006
EP   2226847 A    9/2010
(Continued)

OTHER PUBLICATIONS

Invitation to pay additional fees (Application No. PCT/JP2010/068231), International Searching Authority, dated Nov. 9, 2010.
(Continued)

*Primary Examiner* — Pascal M Bui Pho
*Assistant Examiner* — Jennifer Bennett
(74) *Attorney, Agent, or Firm* — Eric J. Robinson; Robinson Intellectual Property Law Office, P.C.

(57) ABSTRACT

A solid-state image sensor which holds a potential for a long time and includes a thin film transistor with stable electrical characteristics is provided. A reset transistor is omitted by initializing the signal charge storage portion to a cathode potential of a photoelectric conversion element portion in the solid-state image sensor. When a thin film transistor which includes an oxide semiconductor layer and has an off-state current of $1\times10^{-13}$ A or less is used as a transfer transistor of the solid-state image sensor, the potential of the signal charge storage portion is kept constant, so that a dynamic range can be improved. When a silicon semiconductor which can be used for a complementary metal oxide semiconductor is used for a peripheral circuit, a high-speed semiconductor device with low power consumption can be manufactured.

27 Claims, 30 Drawing Sheets

(51) Int. Cl.
*H01L 27/146* (2006.01)
*H04N 5/3745* (2011.01)
*H01L 27/12* (2006.01)

(52) U.S. Cl.
CPC ........ *H04N5/37457* (2013.01); *H01L 27/1203* (2013.01); *H01L 27/1225* (2013.01); *H01L 27/14627* (2013.01); *H01L 27/14643* (2013.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,960,817 | B2 | 11/2005 | Ogura et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,115,923 | B2 | 10/2006 | Hong |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,427,776 | B2 | 9/2008 | Hoffman et al. |
| 7,453,065 | B2 | 11/2008 | Saito et al. |
| 7,453,087 | B2 | 11/2008 | Iwasaki |
| 7,459,760 | B2* | 12/2008 | Ura et al. ...................... 257/444 |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,535,010 | B2 | 5/2009 | Saito et al. |
| 7,601,984 | B2 | 10/2009 | Sano et al. |
| 7,663,116 | B2 | 2/2010 | Saito et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,791,074 | B2 | 9/2010 | Iwasaki |
| 7,800,148 | B2 | 9/2010 | Lee et al. |
| 7,916,195 | B2 | 3/2011 | Kudoh |
| 7,935,582 | B2 | 5/2011 | Iwasaki |
| 7,956,361 | B2 | 6/2011 | Iwasaki |
| 8,084,743 | B2 | 12/2011 | Saito et al. |
| 8,154,024 | B2 | 4/2012 | Iwasaki |
| 8,158,974 | B2 | 4/2012 | Yano et al. |
| 8,193,045 | B2 | 6/2012 | Omura et al. |
| 8,378,391 | B2 | 2/2013 | Koyama et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0051702 | A1* | 3/2005 | Hong et al. ................. 250/214.1 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208285 | A1* | 9/2006 | Inoue et al. .................. 257/239 |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0018075 | A1 | 1/2007 | Cazaux et al. |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252184 | A1* | 11/2007 | Ohkawa ........................ 257/292 |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0054319 | A1 | 3/2008 | Mouli |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0008638 | A1 | 1/2009 | Kang et al. |
| 2009/0065771 | A1* | 3/2009 | Iwasaki et al. .................. 257/43 |
| 2009/0068773 | A1 | 3/2009 | Lai et al. |
| 2009/0073325 | A1 | 3/2009 | Kuwabara et al. |
| 2009/0101948 | A1 | 4/2009 | Park et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305499 | A1* | 12/2009 | Gambino et al. ............. 438/637 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0140609 | A1* | 6/2010 | Yano et al. ..................... 257/43 |
| 2010/0201834 | A1 | 8/2010 | Maruyama et al. |
| 2012/0168748 | A1 | 7/2012 | Yano et al. |

FOREIGN PATENT DOCUMENTS

| | | |
|---|---|---|
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-257263 A | 9/1992 |
| JP | 05-251705 A | 9/1993 |
| JP | 08-064795 A | 3/1996 |
| JP | 08-264794 A | 10/1996 |
| JP | 11-505377 | 5/1999 |

(56) References Cited

FOREIGN PATENT DOCUMENTS

| | | |
|---|---|---|
| JP | 2000-044236 A | 2/2000 |
| JP | 2000-114453 A | 4/2000 |
| JP | 2000-150900 A | 5/2000 |
| JP | 2002-076356 A | 3/2002 |
| JP | 2002-246580 | 8/2002 |
| JP | 2002-289859 A | 10/2002 |
| JP | 2002-353431 A | 12/2002 |
| JP | 2003-086000 A | 3/2003 |
| JP | 2003-086808 A | 3/2003 |
| JP | 2003-197890 A | 7/2003 |
| JP | 2003-258227 A | 9/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2006-165530 A | 6/2006 |
| JP | 2007-103755 A | 4/2007 |
| JP | 2007-103918 A | 4/2007 |
| JP | 2008-198648 A | 8/2008 |
| JP | 2008-218648 A | 9/2008 |
| JP | 2009-010362 A | 1/2009 |
| JP | 2009-016844 A | 1/2009 |
| JP | 2009-105381 | 5/2009 |
| JP | 2009-535819 | 10/2009 |
| WO | WO-2004/114391 | 12/2004 |
| WO | WO 2006/051993 | 5/2006 |
| WO | WO-2007/029844 | 3/2007 |
| WO | WO-2008/027392 | 3/2008 |
| WO | WO-2008/117739 | 10/2008 |
| WO | WO-2008/149873 | 12/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2014, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and It's Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE COMPRISING A GATE OF AN AMPLIFIER TRANSISTOR UNDER AN INSULATING LAYER AND A TRANSFER TRANSISTOR CHANNEL OVER THE INSULATING LAYER THE AMPLIFIER TRANSISTOR AND TRANSFER TRANSISTOR OVERLAPPING

TECHNICAL FIELD

One embodiment of the present invention relates to a semiconductor device including a field-effect transistor formed using an oxide semiconductor.

Note that in this specification, a semiconductor device refers to all devices that can function by utilizing semiconductor properties, and electro-optic devices, semiconductor circuits, and electronic devices are all semiconductor devices.

BACKGROUND ART

A technique for forming a thin film transistor with the use of a semiconductor thin film formed over a substrate having an insulating surface has attracted attention. Thin film transistors have been used in display devices typified by liquid crystal televisions. A silicon-based semiconductor material has been known as a semiconductor thin film applicable to a thin film transistor. As another material, an oxide semiconductor has attracted attention.

As oxide semiconductor materials, zinc oxide and a substance containing zinc oxide have been known. In addition, a thin film transistor formed using an amorphous oxide (an oxide semiconductor) whose carrier (electron) concentration is lower than $10^{18}/cm^3$ has been disclosed (References 1 to 3).

REFERENCE

[Reference 1] Japanese Published Patent Application No. 2006-165527
[Reference 2] Japanese Published Patent Application No. 2006-165528
[Reference 3] Japanese Published Patent Application No. 2006-165529

DISCLOSURE OF INVENTION

In solid-state image sensors which need excellent electrical characteristics, although they have structures similar to those of display devices, field-effect transistors formed using SOI substrates or bulk single crystal silicon substrates are generally used.

However, it cannot be said that field-effect transistors formed using single crystal silicon have ideal electrical characteristics. For example, off-state current (also referred to as leakage current or the like) is not low enough to be regarded as substantially zero. Further, the temperature characteristic of silicon is comparatively greatly changed. In particular, the off-state current of silicon is likely to change. Therefore, in the case where a charge retention semiconductor device such as a solid-state image sensor is formed, it is hoped that a device capable of holding a potential for a long time regardless of the surrounding environment and having lower off-state current will develop.

In view of the foregoing problems, it is an object of one embodiment of the disclosed invention to provide a solid-state image sensor including a field-effect transistor, for example, a thin film transistor with stable electrical characteristics (e.g., significantly low off-state current).

One embodiment of the present invention is a solid-state image sensor which includes at least a photoelectric conversion element and an amplifier transistor formed using silicon semiconductors and includes a pixel where a transfer transistor is formed using an oxide semiconductor.

An oxide semiconductor in one embodiment of the present invention is a semiconductor which is an intrinsic or substantially intrinsic semiconductor by removal of an impurity that is an electron donor and has a larger energy gap than a silicon semiconductor.

In other words, in one embodiment of the present invention, a solid-state image sensor including a thin film transistor whose channel formation region is formed using an oxide semiconductor film is formed. In the oxide semiconductor film, hydrogen or an O—H group contained in an oxide semiconductor is removed so that the concentration of hydrogen in the oxide semiconductor is $5\times10^{19}/cm^3$ or lower, preferably $5\times10^{18}/cm^3$ or lower, more preferably $5\times10^{17}/cm^3$ or lower or lower than $1\times10^{16}/cm^3$ as the lowest value measured by secondary ion mass spectroscopy (SIMS), and the carrier concentration is lower than $1\times10^{14}/cm^3$, preferably $1\times10^{12}/cm^3$ or lower.

The energy gap of the oxide semiconductor is 2 eV or higher, preferably 2.5 eV or higher, more preferably 3 eV or higher. An impurity such as hydrogen, which forms donors, is reduced as much as possible. The carrier concentration is set to $1\times10^{14}/cm^3$ or lower, preferably $1\times10^{12}/cm^3$ or lower.

When such a highly purified oxide semiconductor is used for a channel formation region of a thin film transistor, the thin film transistor has an electrical characteristic of normally off. At a drain voltage of 1 to 10 V, the off-state current of the thin film transistor can be set to $1\times10^{-13}$ A or less or 100 aA/μm (μm indicates the channel width of the thin film transistor) or less, preferably 10 aA/μm or less, more preferably 1 aA/μm or less.

One embodiment of the present invention disclosed in this specification is a semiconductor device which includes a photoelectric conversion element portion buried in a silicon semiconductor, a signal charge storage portion electrically connected to the photoelectric conversion element portion through a transfer transistor, and an amplifier transistor whose gate electrode is electrically connected to the signal charge storage portion. The semiconductor device further includes a pixel portion where a channel formation region of the transfer transistor is formed using an oxide semiconductor and a channel formation region of the amplifier transistor is formed using a silicon semiconductor.

In addition, the amplifier transistor may be a thin film transistor including an oxide semiconductor. Further, a selection transistor may be provided in the pixel portion. Furthermore, in a peripheral circuit portion connected to the pixel portion, a complimentary (CMOS) transistor is preferably formed using a bulk transistor including a silicon semiconductor.

Another embodiment of the present invention disclosed in this specification is a method for operating a semiconductor device including a photoelectric conversion element portion, a transfer transistor electrically connected to the photoelectric conversion element portion, a signal charge storage portion electrically connected to the transfer transistor, and an amplifier transistor electrically connected to the signal charge storage portion. The method includes a step of applying a forward bias to photoelectric conversion element portion, a step of initializing the signal charge storage portion to a cathode potential of the photoelectric conversion element portion by turning on the transfer transistor, a step of applying a reverse bias to the photoelectric conversion element portion, a step of changing the potential of the signal charge storage portion by irradiation of the photoelectric conversion element portion with light, a step of holding the potential of the signal charge storage portion by turning off the transfer transistor, and a step of outputting a signal from the amplifier transistor in accordance with the potential of the signal charge storage portion.

In a conventional CMOS (complementary metal oxide semiconductor) image sensor, the potential of a signal charge storage portion is initialized by operation of a reset transistor. In one embodiment of the present invention, provision of a reset transistor is omitted when the signal charge storage portion is initialized to the cathode potential of the photoelectric conversion element portion (photodiode).

In this specification and the like, terms such as "electrode" and "wiring" do not limit the functions of components. For example, an "electrode" can be used as part of a "wiring", and the "wiring" can be used as part of the "electrode". In addition, the terms such as "electrode" and "wiring" can also mean a combination of a plurality of "electrodes" and "wirings", for example.

In addition, a substrate used as an "SOI substrate" is not limited to a semiconductor substrate such as a silicon wafer, and may be a non-semiconductor substrate such as a glass substrate, a quartz substrate, a sapphire substrate, or a metal substrate. In other words, the "SOI substrate" also includes, in its category, an insulating substrate over which a layer formed using a semiconductor material is provided. Further, in this specification and the like, a "semiconductor substrate" means not only a substrate formed using only a semiconductor material but also all substrates including semiconductor materials. That is, in this specification and the like, the "SOI substrate" is also included in the category of the "semiconductor substrate".

According to one embodiment of the present invention, a reset transistor can be omitted, and the potential of a signal charge storage portion can be kept constant when a thin film transistor which includes an oxide semiconductor and has significantly low off-state current is used as a transfer transistor, so that a dynamic range can be improved. Further, when a silicon semiconductor which can be used for a complementary transistor is used for a peripheral circuit, a high-speed semiconductor device with low power consumption can be obtained.

BEST MODE FOR CARRYING OUT THE INVENTION

Figure 1:
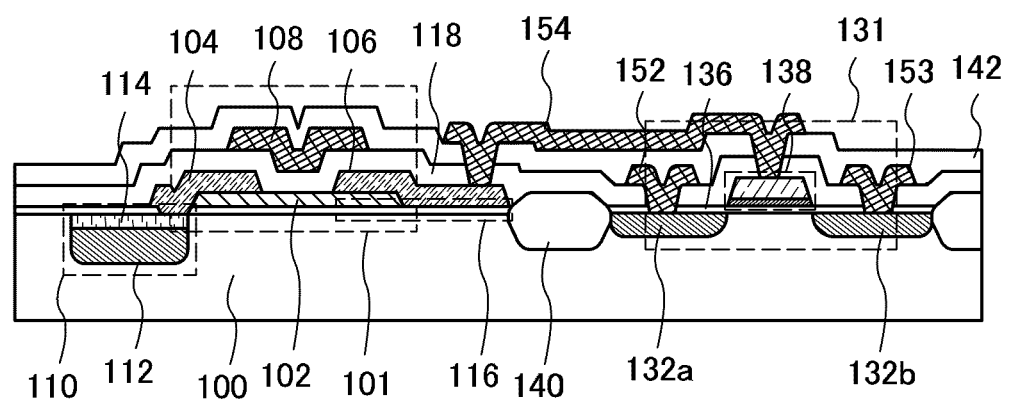
FIG. 1 is a cross-sectional view illustrating a structure of a pixel of a solid-state image sensor.

Embodiments of the present invention will be described in detail with reference to the drawings. Note that the present invention is not limited to the following description, and it will be readily appreciated by those skilled in the art that modes and details of the present invention can be changed in various ways without departing from the spirit and scope of the present invention. Therefore, the present invention should not be construed as being limited to the following description of the embodiments. Note that in structures of the present invention described below, the same portions or portions having similar functions are denoted by the same reference numerals in different drawings, and description thereof is not repeated.

Note that in each drawing described in this specification, the size of each component or each region, layer thickness, and the like are exaggerated for clarity in some cases. Therefore, embodiments of the present invention are not limited to such scales.

Note that in this specification, terms such as "first", "second", and "third" are used in order to avoid confusion among components and do not limit the order or the like. Therefore, for example, the term "first" can be replaced with the term "second", "third", or the like as appropriate.

(Embodiment 1)

One embodiment of the present invention is a semiconductor device including a metal insulator semiconductor element called a MIS (metal insulator semiconductor) transistor. In this specification, an element whose channel formation region is formed using a thin film semiconductor is referred to as a thin film transistor, and an element whose channel formation region is formed using a bulk semiconductor is referred to as a bulk transistor. Note that a semiconductor layer formed using an SOI (silicon on insulator) substrate can be referred to as a thin film, and a transistor including the semiconductor layer is a kind of bulk transistor in this specification.

An example where a pixel of a solid-state image sensor including a thin film transistor in one embodiment of the present invention is provided is described below. In this embodiment, as an example, a thin film transistor included in the pixel of the solid-state image sensor, a photoelectric conversion element connected to the thin film transistor, and a bulk transistor formed using a silicon semiconductor are described. Note that a pixel refers to an element group including elements (e.g., a photoelectric conversion element, a transistor, and a wiring) provided in the solid-state image sensor and an element used for outputting an image by input and output of electrical signals.

Figure 28A:
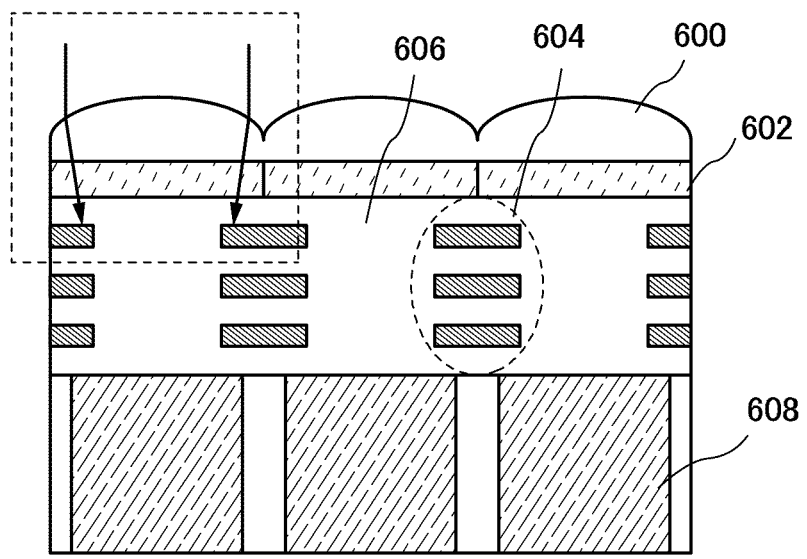
FIGS. 28A and 28B are cross-sectional views illustrating structures of pixels of solid-state image sensors.
Figure 28B:
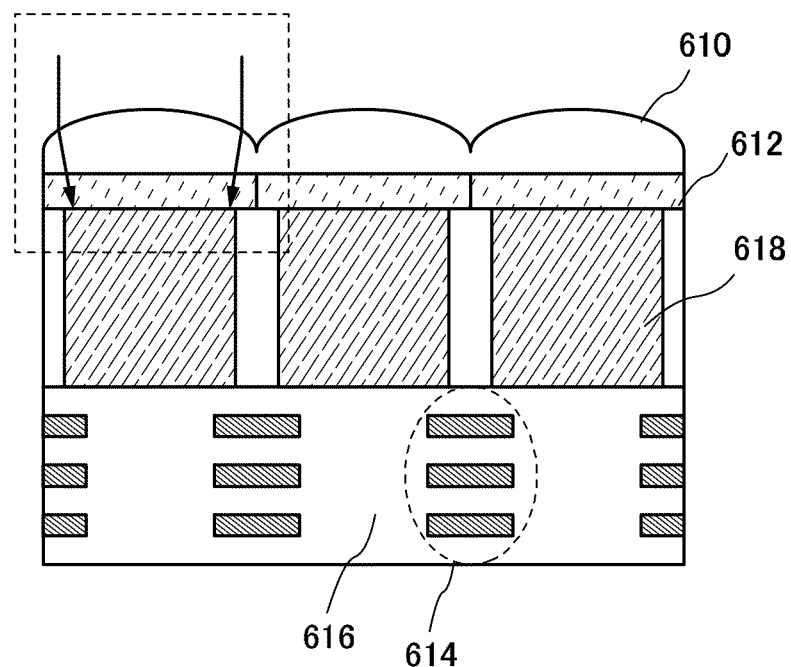

Note that the pixel can have a structure where incident light enters a photoelectric conversion element 608 through a lens 600, a color filter 602, an interlayer insulating film 606, and the like which are formed on the substrate surface side as illustrated in a cross-sectional view in FIG. 28A. Note that as indicated by a region surrounded with a dotted frame, some of light paths indicated by arrows are blocked by some of wiring layers 604 in some cases. Thus, the pixel may have a structure where incident light efficiently enters a photoelectric conversion element 618 by the formation of a lens 610 and a color filter 612 on the substrate rear surface side as illustrated in FIG. 28B.

Further, when it is described that "A and B are connected to each other", the case where A and B are electrically connected to each other and the case where A and B are directly connected to each other are included. Here, each of A and B is an object (e.g., a device, an element, a circuit, a wiring, an electrode, a terminal, a conductive film, or a layer).

FIG. 1 is a cross-sectional view illustrating an example of a pixel part of a solid-state image sensor which is one embodiment of the present invention. FIG. 1 illustrates an example in which a thin film transistor including an oxide semiconductor is used as a transfer transistor 101. An amplifier transistor 131 is formed using an n-channel bulk transistor formed using a single crystal silicon substrate 100. A photoelectric conversion element 110 forms a photodiode including an n-type region 112 and a thin p-type region 114 and is connected to a source electrode 104 of the transfer transistor 101. A signal charge storage portion 116 (also referred to as a floating diffusion) is formed below a drain electrode of the transfer transistor 101. The transfer transistor 101 has a top-gate structure where an oxide semiconductor layer serves as a channel region. The amplifier transistor 131 is an n-channel bulk transistor including n-type regions 132a and 132b and a gate electrode 138. The gate electrode 138 of the amplifier transistor 131 is electrically connected to the signal charge storage portion 116 through a wiring 154.

Note that in the structure illustrated in FIG. 1, a gate insulating layer 136 of the bulk transistor serves as a base insulating layer of the transfer transistor 101 which is a thin film transistor, and the signal charge storage portion 116 forms a capacitor with the gate insulating layer 136 used as a dielectric. In addition, a gate insulating layer 118 of the thin film transistor functions as part of an interlayer insulating layer of the bulk transistor.

Figure 2A:
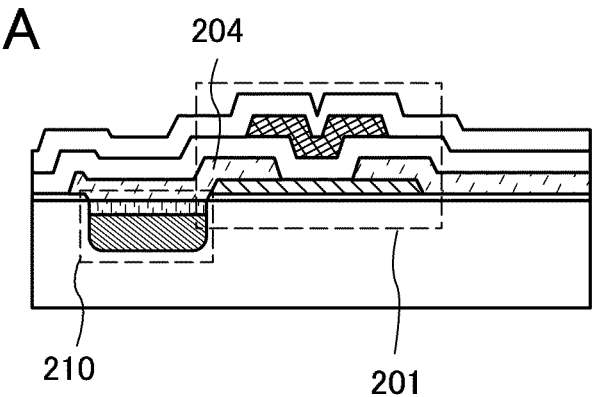
FIGS. 2A and 2B are cross-sectional views illustrating structures of pixels of solid-state image sensors.
Figure 2B:
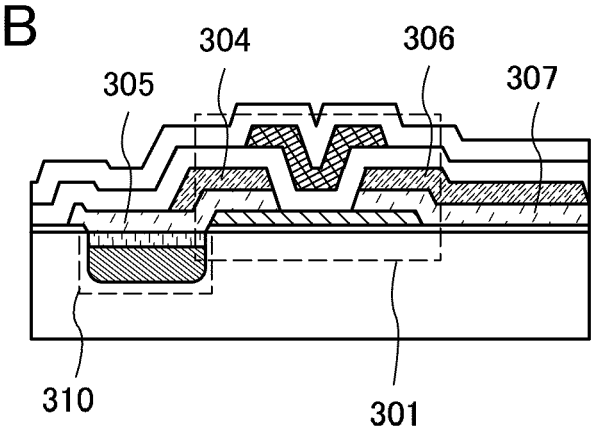

The thin film transistor including an oxide semiconductor in a channel formation region is described as the top-gate thin film transistor as an example; however, the thin film transistor may be a bottom-gate thin film transistor such as an inverted staggered thin film transistor. In addition, it is necessary to irradiate the photoelectric conversion element 110 with light, so that an example is described in which part of the source electrode of the transfer transistor 101 is connected to a light reception portion of the photoelectric conversion element 110; however, the source electrode may be formed using a light-transmitting conductive material so as to be connected to the photoelectric conversion element 110 in a different way. For example, as illustrated in FIG. 2A, when a transistor 201 including a source electrode 204 which is formed using a light-transmitting conductive material is used as the transfer transistor, the source electrode can be connected to part or all of a light reception portion of a photoelectric conversion element 210. Alternatively, as illustrated in FIG. 2B, in order to secure a light path for a photoelectric conversion element 310, a transistor 301 where a source electrode 304 and a drain electrode 306 formed using a low-resistant metal layer and buffer layers 305 and 307 formed using a light-transmitting conductive material layer are stacked may be used as the transfer transistor.

As the photodiode formed as the photoelectric conversion element, a so-called buried photodiode where an n-type region is formed in a p-type single crystal silicon substrate (in the case of an SOI, a p-type single crystal silicon layer) and a thin p-type region is formed thereover is formed. By the formation of the p-type region on a surface of the photodiode, noise due to dark current generated on the surface can be reduced.

Although an example where a single crystal semiconductor substrate is used is described above, an SOI substrate may be used. In addition, the structure of the bulk transistor is not limited to the above structure. An LDD (lightly doped drain) structure where sidewalls are provided at ends of a gate electrode or a structure where low-resistant silicide or the like is formed in part of a source region or a drain region may be employed.

A selection transistor which is electrically connected to the amplifier transistor 131 may be provided in the pixel portion. The amplifier transistor and the selection transistor can be formed using either a silicon semiconductor or an oxide semiconductor. Note that the amplifier transistor is preferably formed using a bulk transistor including a silicon semiconductor layer having a higher amplification factor.

Figure 3:
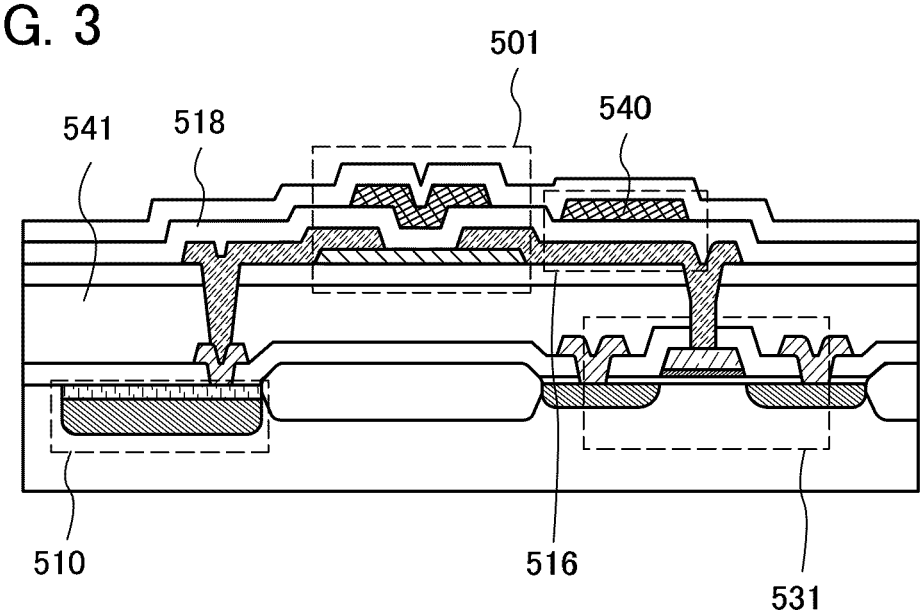
FIG. 3 is a cross-sectional view illustrating a structure of a pixel of a solid-state image sensor.

Alternatively, an insulating layer can be formed over the bulk transistor and a thin film transistor can be formed thereover. For example, when the transfer transistor formed using a thin film transistor is provided over the amplifier transistor formed using a bulk transistor, the area of the transistor needed per pixel is about half to two thirds, so that the integration level can be improved, a light reception area can be increased, and noise can be reduced. FIG. 3 illustrates an example of such a structure. A photoelectric conversion element 510 and an amplifier transistor 531 formed using a bulk transistor are formed as a lower layer, and a transfer transistor 501 formed using a thin film transistor is formed as an upper layer with an insulating film 541 provided therebetween. A step of forming the photoelectric conversion element and the bulk transistor and a step of forming the thin film transistor can be separated from each other; thus, the steps can be controlled easily. Note that a capacitor electrode 540 used for forming a signal charge storage portion 516 is preferably provided.

Here, in one embodiment of the present invention, the thin film transistor including an oxide semiconductor layer is provided, and a reset transistor that is a general component of a CMOS (complementary metal oxide semiconductor) image sensor that is a solid-state image sensor is omitted. In a conventional CMOS image sensor, the potential of a signal charge storage portion is initialized by the operation of a reset transistor. In one embodiment of the present invention, the signal charge storage portion can be initialized to a cathode potential of the photodiode. First, when a forward bias is applied to the photodiode and the transfer transistor is turned on, the signal charge storage portion has the same potential as a cathode of the photodiode. Then, when a reverse bias is applied to the photodiode and the photodiode is irradiated with light, the potential of the signal charge storage portion is lowered by discharge. At this time, the transfer transistor is turned off, and a signal can be output from the amplifier transistor in accordance with the held potential.

With a combination of the thin film transistor and the bulk transistor having the above structures, the signal charge storage portion can hold a potential for a longer time and a pixel portion of a solid-state image sensor having a wide dynamic range can be formed. Note that in order to realize this embodiment of the present invention, a thin film transistor whose off-state current is significantly low is preferably used. A method for manufacturing such a thin film transistor is described below.

In one embodiment of the present invention, a pixel portion of a solid-state image sensor is formed with a combination of a bulk transistor including a single crystal silicon semiconductor and a thin film transistor including an oxide semiconductor having significantly favorable electrical characteristics. Therefore, a method for forming the thin film transistor including an oxide semiconductor is mainly described in detail.

As an example, a method for forming the structure illustrated in FIG. 1 is described with reference to cross-sectional views in FIGS. 4A to 4C and FIGS. 5A to 5C. First, an element formation region isolated with an insulating film 140 (also referred to as a field oxide film) is formed over a p-type single crystal silicon substrate 100. An element isolation region can be formed by local oxidation of silicon (LOCOS), shallow trench isolation (STI), or the like.

Here, the substrate is not limited to the single crystal silicon substrate. An SOI (silicon on insulator) substrate or the like can be used.

Note that in this embodiment, a p-type single crystal silicon substrate is used because a buried photodiode and an n-channel bulk transistor are used; however, an n-type single crystal silicon substrate can be used when a p-well is formed.

Next, the gate insulating layer 136 is formed so as to cover the element formation region. For example, a silicon oxide film can be formed by oxidation of a surface of the element formation region provided in the single crystal silicon substrate 100 with heat treatment. Alternatively, the gate insulating layer 136 may have a layered structure of a silicon oxide film and a silicon oxynitride film by the formation of the silicon oxide film by thermal oxidation and nitriding of a surface of the silicon oxide film by nitriding treatment.

As another method, for example, by oxidation treatment or nitriding treatment with high-density plasma treatment performed on the surface of the element formation region provided in the single crystal silicon substrate 100, a silicon oxide film or a silicon nitride film can be formed as the gate insulating layer 136. Further, after oxidation treatment is performed on the surface of the element formation region by high-density plasma treatment, nitriding treatment may be performed by high-density plasma treatment. In this case, a silicon oxide film is formed on and in contact with the surface of the element formation region and a silicon oxynitride film is formed over the silicon oxide film, so that the gate insulating layer 136 has a layered structure of the silicon oxide film and the silicon oxynitride film.

Next, a conductive layer is formed so as to cover the gate insulating layer 136. Here, a conductive layer 138a and a conductive layer 138b are sequentially stacked. Needless to say, the conductive layer may have a single-layer structure or a layered structure including two or more layers.

The conductive layers 138a and 138b can be formed using an element selected from tantalum (Ta), tungsten (W), titanium (Ti), molybdenum (Mo), aluminum (Al), copper (Cu), chromium (Cr), or niobium (Nb), or an alloy material or a compound material containing the element as its main component. Alternatively, a metal nitride film obtained by nitriding of the above element can be used. Alternatively, a semiconductor material typified by polycrystalline silicon doped with an impurity element such as phosphorus can be used.

Here, a layered structure is employed in which the conductive layer 138a is formed using tantalum nitride and the conductive layer 138b is formed thereover using tungsten. Alternatively, a single layer of tungsten nitride, molybdenum nitride, or titanium nitride or stacked films thereof can be used as the conductive layer 138a, and a single layer of tantalum, molybdenum, or titanium or stacked films thereof can be used as the conductive layer 138b.

Next, by selectively etching and removing the conductive layers 138a and 138b which are stacked, the conductive layers 138a and 138b are partly left over the gate insulating layer 136 so that the gate electrode 138 is formed.

Next, a resist mask is selectively formed so as to cover regions except the element formation region, and the n-type regions 132a and 132b are formed by introduction of an impurity element with the use of the resist mask and the gate electrode 138 as masks. Here, since the n-channel bulk transistor is formed, an impurity element imparting n-type conductivity (e.g., phosphorus (P) or arsenic (As)) can be used as the impurity element.

Then, in order to form a photodiode that is a photoelectric conversion element, a resist mask is selectively formed. First, after a p-n junction is formed by introduction of an impurity element imparting n-type conductivity (e.g., phosphorus (P) or arsenic (As)) into the p-type single crystal silicon substrate, an impurity element imparting p-type conductivity (e.g., boron (B)) is introduced into a surface layer in the n-type region; thus, the buried photodiode can be formed.

Figure 4A:
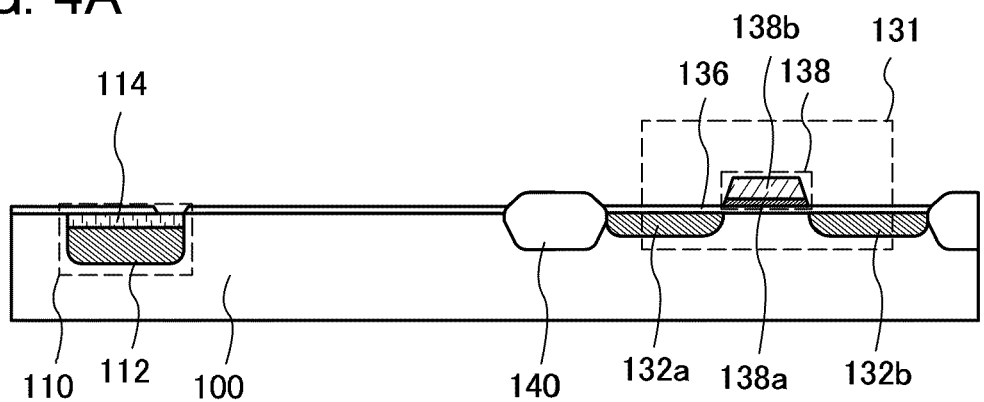
FIGS. 4A to 4C are cross-sectional views illustrating a method for manufacturing a solid-state image sensor.

At this stage, the structures of the bulk transistor illustrated on the right of FIG. 4A and the photodiode illustrated on the left of FIG. 4A are completed.

Next, a method for forming a thin film transistor in which an oxide semiconductor layer is used as a channel region is described.

In this embodiment, a thin film transistor is formed over the gate insulating layer 136 of the bulk transistor which has been provided on the single crystal silicon substrate 100. That is, the gate insulating layer 136 can serve as a base film of the thin film transistor and the gate insulating layer of the bulk transistor. Note that an insulating layer may be formed by the following method and stacked layers may be used as a base film.

As the insulating layer which is in contact with the oxide semiconductor layer, an oxide insulating layer such as a silicon oxide layer, a silicon oxynitride layer, an aluminum oxide layer, or an aluminum oxynitride layer is preferably used. As a method for forming the insulating layer, plasma-enhanced CVD, sputtering, or the like can be used. In order that a large amount of hydrogen be not contained in the insulating layer, the insulating layer is preferably formed by sputtering.

An example is described in which a silicon oxide layer is formed as the insulating layer by sputtering. The silicon oxide layer is deposited over the single crystal silicon substrate 100 as the insulating layer in such a manner that the single crystal silicon substrate 100 is transferred to a treatment chamber, a sputtering gas containing high-purity oxygen from which hydrogen and moisture are removed is introduced, and a silicon target is used. In addition, the single crystal silicon substrate 100 may be at room temperature or may be heated.

For example, the silicon oxide layer is deposited by RF sputtering under the following condition: quartz (preferably synthetic quartz) is used as a target; the temperature of the substrate is 108° C.; the distance between the substrate and a target (the T-S distance) is 60 mm; the pressure is 0.4 Pa; the high-frequency power is 1.5 kW; the atmosphere contains oxygen and argon (an oxygen flow rate of 25 sccm: an argon flow rate of 25 sccm=1:1); and the thickness is 100 nm. Instead of quartz, silicon can be used as a target for depositing the silicon oxide layer. In this case, oxygen or a mixed gas of oxygen and argon is used as a sputtering gas.

In this case, it is preferable to form the insulating layer while moisture remaining in the treatment chamber is removed in order that hydrogen, a hydroxyl group, or moisture be not contained in the insulating layer.

In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), and the like are exhausted from the treatment chamber with the use of a cryopump. Therefore, the concentration of an impurity contained in the insulating layer which is deposited in the treatment chamber can be lowered.

As a sputtering gas used for deposition of the insulating layer, a high-purity gas from which an impurity such as hydrogen, water, a hydroxyl group, or hydride is removed to about a concentration of ppm or ppb is preferably used.

Examples of sputtering include RF sputtering in which a high-frequency power source is used for a sputtering power source, DC sputtering in which a DC power source is used, and pulsed DC sputtering in which a bias is applied in a pulsed manner. RF sputtering is mainly used in the case where an insulating film is deposited, and DC sputtering is mainly used in the case where a conductive film is deposited.

In addition, there is also a multi-source sputtering apparatus in which a plurality of targets of different materials can be set. With the multi-source sputtering apparatus, films of different materials can be deposited to be stacked in the same chamber, or a film of plural kinds of materials can be deposited by electric discharge at the same time in the same chamber.

In addition, there are a sputtering apparatus provided with a magnet system inside the chamber and used for magnetron sputtering, and a sputtering apparatus used for ECR sputtering in which plasma generated with the use of microwaves is used without using glow discharge.

Further, as a deposition method using sputtering, reactive sputtering in which a target substance and a sputtering gas component are chemically reacted with each other during deposition to form a thin compound film thereof, or bias sputtering in which voltage is also applied to a substrate during deposition can be used.

Furthermore, the insulating layer may have a layered structure. For example, the insulating layer may have a layered structure in which a nitride insulating layer such as a silicon nitride layer, silicon nitride oxide layer, an aluminum nitride layer, or an aluminum nitride oxide layer and the above oxide insulating layer are stacked in that order from the substrate side.

For example, a silicon nitride layer is deposited in such a manner that a sputtering gas containing high-purity nitrogen from which hydrogen and moisture are removed is introduced between the silicon oxide layer and the substrate and a silicon target is used. Also in this case, as in the case of the silicon oxide layer, it is preferable to deposit a silicon nitride layer while moisture remaining in the treatment chamber is removed.

Also in the case where a silicon nitride layer is deposited, the substrate may be heated in deposition.

In the case where a silicon nitride layer and a silicon oxide layer are stacked as the insulating layer, the silicon nitride layer and the silicon oxide layer can be deposited in the same treatment chamber with the use of a common silicon target. First, the silicon nitride layer is deposited in such a manner that a sputtering gas containing nitrogen is introduced and a silicon target mounted on the treatment chamber is used. Then, the silicon oxide layer is deposited in such a manner that the gas is changed to a sputtering gas containing oxygen and the same silicon target is used. The silicon nitride layer and the silicon oxide layer can be deposited successively without exposure to the air; thus, adsorption of an impurity such as hydrogen or moisture on a surface of the silicon nitride layer can be prevented.

Then, an oxide semiconductor film with a thickness of 2 to 200 nm is formed over the insulating layer (the gate insulating layer 136 in this embodiment).

In order that hydrogen, a hydroxyl group, and moisture be contained in the oxide semiconductor film as little as possible, it is preferable that an impurity such as hydrogen or moisture that is adsorbed on the single crystal silicon substrate 100 be eliminated and exhausted by preheating of the single crystal silicon substrate 100 in a preheating chamber of a sputtering apparatus, as pretreatment for deposition. As an exhaustion means provided in the preheating chamber, a cryopump is preferable. Note that the preheating treatment can be omitted. In addition, the preheating may be performed before the deposition of the gate insulating layer 118 of the thin film transistor to be formed later, or may be performed before the deposition of a conductive layer serving as a source electrode and a drain electrode to be formed later.

Note that before the oxide semiconductor film is deposited by sputtering, dust on a surface of the insulating layer is preferably removed by reverse sputtering in which an argon gas is introduced and plasma is generated. The reverse sputtering refers to a method in which voltage is applied to a substrate side with the use of an RF power source in an argon atmosphere and ionized argon collides with the substrate so that a substrate surface is modified. Note that nitrogen, helium, oxygen, or the like may be used instead of argon.

The oxide semiconductor film is deposited by sputtering. As the oxide semiconductor film, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, a Zn—Mg—O film, a Sn—Mg—O film, an In—Mg—O film, an In—O film, a Sn—O film, or a Zn—O film can be used. Further, $SiO_2$ may be contained in the above oxide semiconductor film.

As the oxide semiconductor film, a thin film expressed by $InMO_3(ZnO)_m$ (m>0) can be used. Here, M denotes one or more metal elements selected from Ga, Al, Mn, or Co. For example, M can be Ga, Ga and Al, Ga and Mn, Ga and Co, or the like. Among oxide semiconductor films whose composition formulae are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film.

In this embodiment, the oxide semiconductor film is deposited by sputtering with the use of an In—Ga—Zn—O-based metal oxide target. Alternatively, the oxide semiconductor film can be deposited by sputtering in a rare gas (typically argon) atmosphere, an oxygen atmosphere, or an atmosphere including a rare gas (typically argon) and oxygen.

As a sputtering gas used for deposition of the oxide semiconductor film, a high-purity gas from which an impurity such as hydrogen, water, a hydroxyl group, or hydride is removed to about a concentration of ppm or ppb is preferably used.

As a target used for forming the oxide semiconductor film by sputtering, a metal oxide target containing zinc oxide as a main component can be used. For example, a metal oxide target having a composition ratio of $In_2O_3:Ga_2O_3:ZnO=1:1:1$ [molar ratio] may be used. Alternatively, a metal oxide target having a composition ratio of $In_2O_3:Ga_2O_3:ZnO=1:1:2$ [molar ratio] may be used. The filling rate of the metal oxide target is 90 to 100%, preferably 95 to 99.9%. With the use of the metal oxide target with a high filling rate, the deposited oxide semiconductor film has high density.

The oxide semiconductor film is deposited over the insulating layer in such a manner that the substrate is held in a treatment chamber kept in a reduced pressure state, moisture remaining in the treatment chamber is removed, a sputtering gas from which hydrogen and moisture are removed is introduced, and a metal oxide is used as a target. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), and the like are exhausted from the treatment chamber with the use of a cryopump. Therefore, the concentration of an impurity contained in the oxide semiconductor film which is deposited in the treatment chamber can be lowered. Further, the substrate may be heated when the oxide semiconductor film is deposited.

As an example of the deposition condition, the following condition is employed: the substrate temperature is room temperature, the distance between the substrate and the target is 110 mm, the pressure is 0.4 Pa, the direct current (DC) power is 0.5 kW, and an atmosphere containing oxygen and argon (the flow rate of oxygen is 15 sccm and the flow rate of argon is 30 sccm) is used. Note that it is preferable that pulsed direct-current (DC) power be used because powdered substances (also referred to as particles or dust) generated in deposition can be reduced and the film thickness can be uniform. The thickness of the oxide semiconductor film is preferably 5 to 30 nm. Note that the appropriate thickness of the oxide semiconductor film differs depending on an oxide semiconductor material, and the thickness may be set as appropriate depending on the material.

Figure 4B:
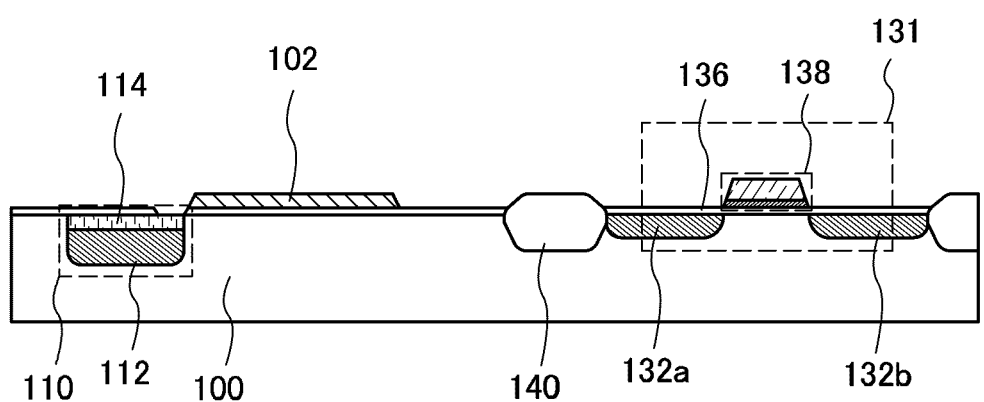

Then, the oxide semiconductor film is processed into an island-shaped oxide semiconductor layer 102 by a first photolithography process and an etching process (see FIG. 4B).

Note that a resist mask used for formation of the island-shaped oxide semiconductor layer may be formed by an inkjet method. When the resist mask is formed by an inkjet method, a photomask is not used; thus, manufacturing cost can be reduced. Further, as the etching of the oxide semiconductor film, dry etching, wet etching, or both of them may be employed.

As an etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, parallel plate RIE (reactive ion etching) or ICP (inductively coupled plasma) etching can be used. In order to etch the film to have a desired shape, the etching conditions (the amount of electric power applied to a coil-shaped electrode, the amount of electric power applied to an electrode on a substrate side, the temperature of the electrode on the substrate side, and the like) are adjusted as appropriate.

As an etchant used for wet etching, a solution obtained by mixture of phosphoric acid, acetic acid, and nitric acid, an ammonia hydrogen peroxide mixture (a hydrogen peroxide solution at 31 wt %: ammonia water at 28 wt %: water=5:2:2), or the like can be used. Alternatively, ITO-07N (produced by KANTO CHEMICAL CO., INC.) may be used.

The etchant used in the wet etching is removed together with the etched material by cleaning. Waste liquid of the etchant including the removed material may be purified and the material contained in the waste liquid may be reused. When a material such as indium contained in the oxide semiconductor layer is collected from the waste liquid after the etching and reused, the resources can be efficiently used and cost can be reduced.

In order to etch the oxide semiconductor film to have a desired shape, the etching conditions (an etchant, etching time, temperature, and the like) are adjusted as appropriate depending on the material.

In this embodiment, the oxide semiconductor film is processed into the island-shaped oxide semiconductor layer 102 by wet etching with the use of a solution where phosphoric acid, acetic acid, and nitric acid are mixed as an etchant.

In this embodiment, the oxide semiconductor layer 102 is subjected to first heat treatment in a rare gas (e.g., nitrogen, helium, neon, or argon) atmosphere. The temperature of the first heat treatment is 400 to 750° C., preferably higher than or equal to 400° C. and lower than the strain point of the substrate. Here, after the substrate is put in an electric furnace which is a kind of heat treatment apparatus, the oxide semiconductor layer is subjected to heat treatment at 450° C. for one hour in a nitrogen atmosphere. When temperature is lowered from the heat treatment temperature, the atmosphere may be changed into an oxygen atmosphere. Through the first heat treatment, the oxide semiconductor layer 102 can be dehydrated or dehydrogenated.

The heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon, is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

Note that in the first heat treatment, it is preferable that water, hydrogen, and the like be not contained in an atmosphere gas such as nitrogen, helium, neon, or argon. Further, the purity of the atmosphere gas is preferably 6N (99.9999%) or higher, more preferably 7N (99.99999%) or higher (that is, the impurity concentration is 1 ppm or lower, preferably 0.1 ppm or lower). In the case where oxygen is used as the atmosphere gas, the atmosphere gas preferably has similar purity.

Further, the oxide semiconductor layer is crystallized and the crystal structure of the oxide semiconductor layer is changed into a microcrystalline structure or a polycrystalline structure depending on the condition of the first heat treatment or the material of the oxide semiconductor layer in some cases. For example, the oxide semiconductor layer might be crystallized to be a microcrystalline oxide semiconductor layer having a degree of crystallinity of 90% or more, or 80% or more. Further, depending on the condition of the first heat treatment or the material of the oxide semiconductor layer, the oxide semiconductor layer might become an amorphous oxide semiconductor layer containing no crystalline component. The oxide semiconductor layer might become an oxide semiconductor layer in which a microcrystalline portion (with a grain diameter of 1 to 20 nm, typically 2 to 4 nm) is mixed into an amorphous oxide semiconductor.

In addition, the first heat treatment for the oxide semiconductor layer can be performed on the oxide semiconductor film before being processed into the island-shaped oxide semiconductor layer.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, an opening which reaches the p-type region in an upper layer of the photodiode is formed in the insulating layer by a second photolithography process and an etching process, and a conductive layer is formed over the insulating layer and the oxide semiconductor layer 102. The conductive layer may be formed by sputtering or vacuum evaporation. As the material of the conductive layer, any of the following materials can be used: an element selected from aluminum, chromium, copper, tantalum, titanium, molybdenum, or tungsten; an alloy including any of these elements; an alloy film including the above elements in combination; or the like. Further, one or more materials selected from manganese, magnesium, zirconium, beryllium, or yttrium may be used. Furthermore, the metal conductive layer may have a single-layer structure or a layered structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in that order, or the like can be used. Alternatively, a film, an alloy film, or a nitride film which contains aluminum and one or more of elements selected from titanium, tantalum, tungsten, molybdenum, chromium, neodymium, or scandium may be used.

Figure 4C:
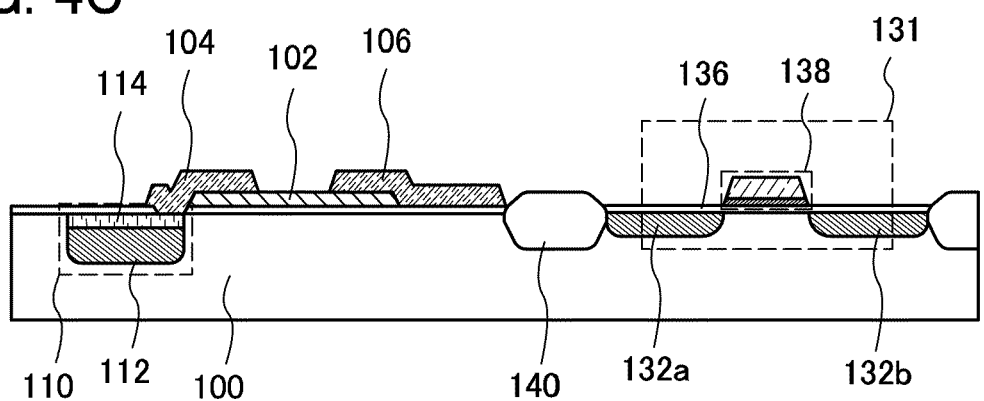

Next, a resist mask is formed over the conductive layer in a third photolithography process; the source electrode 104 and a drain electrode 106 of the thin film transistor are formed by selective etching; then, the resist mask is removed (see FIG. 4C). Note that when end portions of the formed source electrode and the formed drain electrode are tapered, coverage with a gate insulating layer stacked thereover is improved, which is preferable.

In this embodiment, a 150-nm-thick titanium film is formed as the source electrode 104 and the drain electrode 106 by sputtering.

Note that each material and etching conditions are adjusted as appropriate so that part of the oxide semiconductor layer 102 is not removed in etching of the conductive layer and the insulating layer formed below the oxide semiconductor layer is not exposed.

In this embodiment, a titanium film is used as the conductive layer, an In—Ga—Zn—O-based oxide semiconductor is used for the oxide semiconductor layer 102, and an ammonia hydrogen peroxide mixture (a mixture of ammonia, water, and a hydrogen peroxide solution) is used as an etchant.

Note that in the third photolithography process and an etching process, only part of the oxide semiconductor layer 102 is etched so that an oxide semiconductor layer having a groove (a depression) is formed in some cases. The resist mask used for forming the source electrode 104 and the drain electrode 106 may be formed by an inkjet method. When the resist mask is formed by an inkjet method, a photomask is not used; thus, manufacturing cost can be reduced.

An ultraviolet ray, a KrF laser beam, or an ArF laser beam is used for exposure when the resist mask is formed in the third photolithography process. The channel length L of a thin film transistor to be formed later is determined by a pitch between a lower end of the source electrode and a lower end of the drain electrode that are adjacent to each other over the oxide semiconductor layer 102. Note that when exposure is performed under a condition that the channel length L is less than 25 nm, the exposure when the resist mask is formed in the second photolithography process is performed using an extreme ultraviolet ray whose wavelength is extremely short (several nanometers to several tens of nanometers). In exposure with an extreme ultraviolet ray, resolution is high and the depth of focus is large. Therefore, the channel length L of the thin film transistor to be formed later can be 10 to 1000 nm, and a circuit can operate at higher speed. Further, since the amount of off-state current is extremely small, power consumption can be reduced.

Figure 5A:
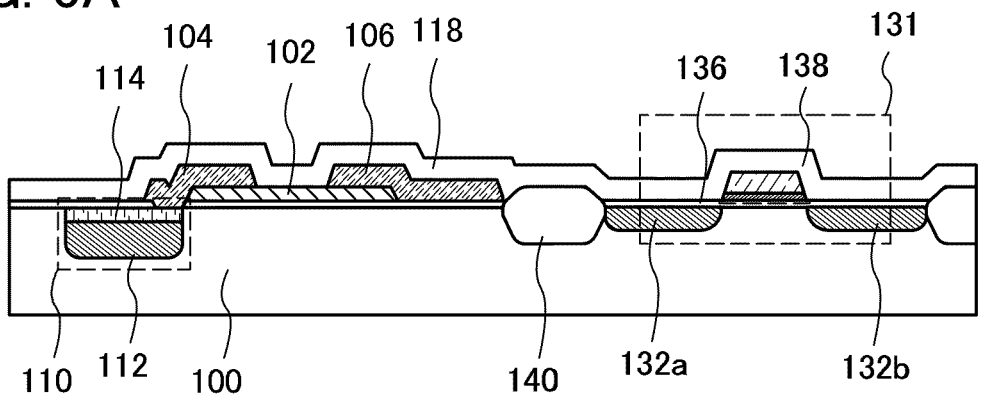
FIGS. 5A to 5C are cross-sectional views illustrating the method for manufacturing a solid-state image sensor.

Next, the gate insulating layer 118 is formed over the insulating layer, the oxide semiconductor layer 102, the source electrode 104, and the drain electrode 106 (see FIG. 5A). In this case, the gate insulating layer 118 is also deposited over the bulk transistor and serves as part of an interlayer insulating film.

Here, an oxide semiconductor (a highly purified oxide semiconductor) which is made to be intrinsic (i-type) or substantially intrinsic by removal of an impurity is highly sensitive to an interface state and interface charge; thus, an interface between the oxide semiconductor and the gate insulating layer is important. Therefore, the gate insulating layer (GI) which is in contact with the highly purified oxide semiconductor needs high quality.

For example, high-density plasma-enhanced CVD using microwaves (2.45 GHz) is preferable because a dense high-quality insulating layer having high withstand voltage can be formed. This is because when the highly purified oxide semiconductor is closely in contact with the high-quality gate insulating layer, the interface state can be reduced and interface properties can be favorable. Needless to say, a different deposition method such as sputtering or plasma-enhanced CVD can be used as long as a high-quality insulating layer can be formed as a gate insulating layer. In addition, any gate insulating layer can be used as long as film quality and properties of an interface with an oxide semiconductor of the gate insulating layer are modified by heat treatment performed after deposition. In either case, any gate insulating layer can be used as long as film quality as a gate insulating layer is high, interface state density with an oxide semiconductor is decreased, and a favorable interface can be formed.

In a bias temperature test (BT test) at 85° C. and 2×10$^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in one embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable even when the BT test is performed.

In this embodiment, the gate insulating layer 118 is formed using a high-density plasma-enhanced CVD apparatus using microwaves (2.45 GHz). Here, a high-density plasma-enhanced CVD apparatus refers to an apparatus which can realize a plasma density of 1×10$^{11}$/cm$^3$ or higher. For example, plasma is generated by application of a microwave power of 3 to 6 kW so that an insulating layer is formed.

A monosilane gas (SiH$_4$), nitrous oxide (N$_2$O), and a rare gas are introduced into a chamber as a source gas, and high-density plasma is generated at a pressure of 10 to 30 Pa so that an insulating layer is formed over the substrate. After that, the supply of a monosilane gas is stopped, and nitrous oxide (N$_2$O) and a rare gas are introduced without exposure to the air, so that plasma treatment may be performed on a surface of the insulating layer. The plasma treatment performed on the surface of the insulating layer by introduction of at least nitrous oxide (N$_2$O) and a rare gas is performed after the insulating layer is formed. The insulating layer formed through the above process corresponds to an insulating layer whose reliability can be secured even though it has small thickness, for example, a thickness less than 100 nm.

When the gate insulating layer 118 is formed, the flow ratio of the monosilane gas (SiH$_4$) to nitrous oxide (N$_2$O) which are introduced into the chamber is in the range of 1:10 to 1:200. In addition, as the rare gas which is introduced into the chamber, helium, argon, krypton, xenon, or the like can be used. In particular, argon, which is inexpensive, is preferably used.

In addition, since the insulating layer formed using the high-density plasma-enhanced CVD apparatus can have a uniform thickness, the insulating layer has excellent step coverage. Further, as for the insulating layer formed using the high-density plasma-enhanced CVD apparatus, the thickness of a thin film can be controlled precisely.

The film quality of the insulating layer formed through the above process is greatly different from that of an insulating layer formed using a conventional parallel plate PECVD apparatus. The etching rate of the insulating layer formed through the above process is lower than that of the insulating layer formed using the conventional parallel plate PECVD apparatus by 10% or more or 20% or more in the case where the etching rates with the same etchant are compared to each other. Thus, it can be said that the insulating layer formed using the high-density plasma-enhanced CVD apparatus is a dense layer.

In this embodiment, as the gate insulating layer 118, a 100-nm-thick silicon oxynitride layer (also referred to as SiO$_x$N$_y$, where x>y>0) formed using a high-density plasma-enhanced CVD apparatus is used.

The gate insulating layer 118 can be formed to have a single-layer structure or a layered structure including one or more of a silicon oxide layer, a silicon nitride layer, a silicon oxynitride layer, a silicon nitride oxide layer, and an aluminum oxide layer by plasma-enhanced CVD, sputtering, or the like as a different method. Note that the gate insulating layer 118 is preferably formed by sputtering in order not to include a large amount of hydrogen. In the case where a silicon oxide layer is formed by sputtering, a silicon target or a quartz target is used as a target, and oxygen or a mixed gas of oxygen and argon is used as a sputtering gas.

The gate insulating layer 118 can have a structure where a silicon oxide layer and a silicon nitride layer are stacked from the source electrode 104 and the drain electrode 106. For example, a 100-nm-thick gate insulating layer may be formed in such a manner that a silicon oxide layer (SiO$_x$ (x>0)) with a thickness of 5 to 300 nm is formed as a first gate insulating layer and a silicon nitride layer (SiN$_y$ (y>0)) with a thickness of 50 to 200 nm is stacked over the first gate insulating layer as a second gate insulating film by sputtering.

Figure 5B:
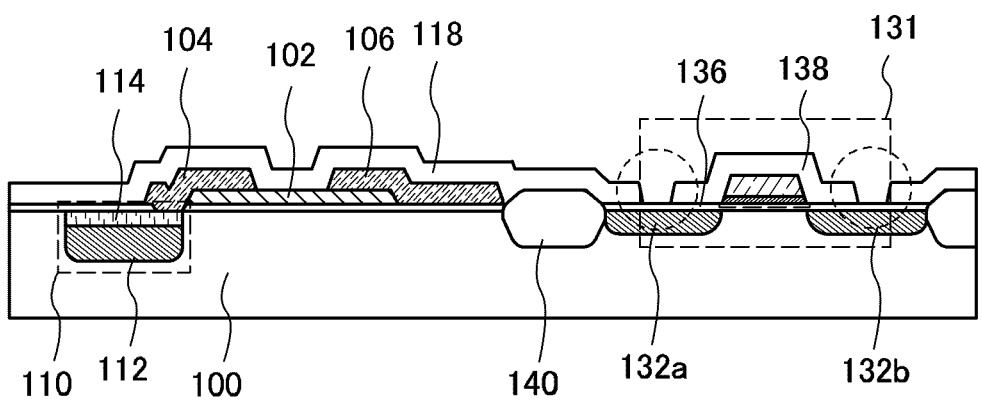

Next, a resist mask is formed in a fourth photolithography process and part of the gate insulating layer 118 is removed by selective etching, so that openings which reach the n-type regions 132a and 132b serving as a source electrode and a drain electrode of the bulk transistor are formed (see FIG. 5B).

Then, a conductive layer is formed over the gate insulating layer 118 in which the openings are formed, and then the gate electrode 108 and wiring layers 152 and 153 are formed in a fifth photolithography process. Note that a resist mask may be formed by an inkjet method. When the resist mask is formed by an inkjet method, a photomask is not used; thus, manufacturing cost can be reduced.

The gate electrode 108 and the wiring layers 152 and 153 can be formed to have a single layer or a stacked layer of a metal material such as molybdenum, titanium, chromium, tantalum, tungsten, aluminum, copper, neodymium, or scandium, or an alloy material which includes any of these materials as a main component.

For example, as a two-layer structure of the gate electrode 108 and the wiring layers 152 and 153, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure in which a titanium nitride layer and a molybdenum layer are stacked. As a three-layer structure, a three-layer structure in which a tungsten layer or a tungsten nitride layer, an alloy of aluminum and silicon or an alloy of aluminum and titanium, and a titanium nitride layer or a titanium layer are stacked is preferable. Note that the gate electrode can be formed using a light-transmitting conductive layer. As an example of the material of the light-transmitting conductive layer, a light-transmitting conductive oxide or the like can be given.

In this embodiment, as the gate electrode 108 and the wiring layers 152 and 153, a 150-nm-thick titanium film is formed by sputtering.

Next, second heat treatment (preferably at 200 to 400° C., for example, 250 to 350° C.) is performed in an inert gas atmosphere or an oxygen gas atmosphere. In this embodiment, the second heat treatment is performed at 250° C. for one hour in a nitrogen atmosphere. Alternatively, the second heat treatment may be performed after a protective insulating layer or a planarization insulating layer is formed over the thin film transistor and the bulk transistor.

Furthermore, heat treatment may be performed at 100 to 200° C. for 1 to 30 hours in an air atmosphere. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature. Further, this heat treatment may be performed under a reduced pressure before the formation of the oxide insulating layer. When the heat treatment is performed under a reduced pressure, the heating time can be shortened.

Figure 5C:
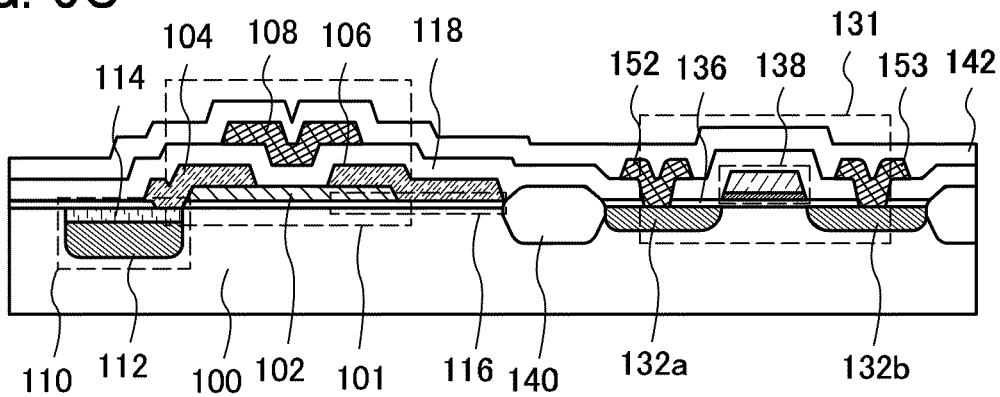

Through the above steps, the thin film transistor including the oxide semiconductor layer whose concentration of hydrogen, moisture, hydride, or hydroxide is lowered can be formed (see FIG. 5C). Here, the thin film transistor can be used as the transfer transistor 101, and the bulk transistor can be used as the amplifier transistor 131.

A protective insulating layer 142 or a planarization insulating layer for planarization (not illustrated) may be provided over the thin film transistor and the bulk transistor. For example, the protective insulating layer 142 can be formed to have a single-layer structure or a layered structure including a silicon oxide layer, a silicon nitride layer, a silicon oxynitride layer, a silicon nitride oxide layer, or an aluminum oxide layer.

The planarization insulating layer can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation on the method for forming the planarization insulating layer. The planarization insulating layer can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

When remaining moisture in the atmosphere is removed at the time of the deposition of the oxide semiconductor film, the concentration of hydrogen and hydride in the oxide semiconductor film can be lowered. Thus, the oxide semiconductor film can be stabilized.

In the above manner, a highly reliable semiconductor device with stable electrical characteristics that includes a thin film transistor having an oxide semiconductor layer can be provided.

This embodiment mode can be combined with any of the other embodiments as appropriate.

(Embodiment 2)

In one embodiment of the present invention, an oxide semiconductor which is an intrinsic or substantially intrinsic semiconductor by removal of an impurity that might be a carrier donor (or an acceptor) in the oxide semiconductor to a very low level is used for a thin film transistor. In this embodiment, measured values of off-state current in a test element group (also referred to as TEG) are described below.

Figure 6:
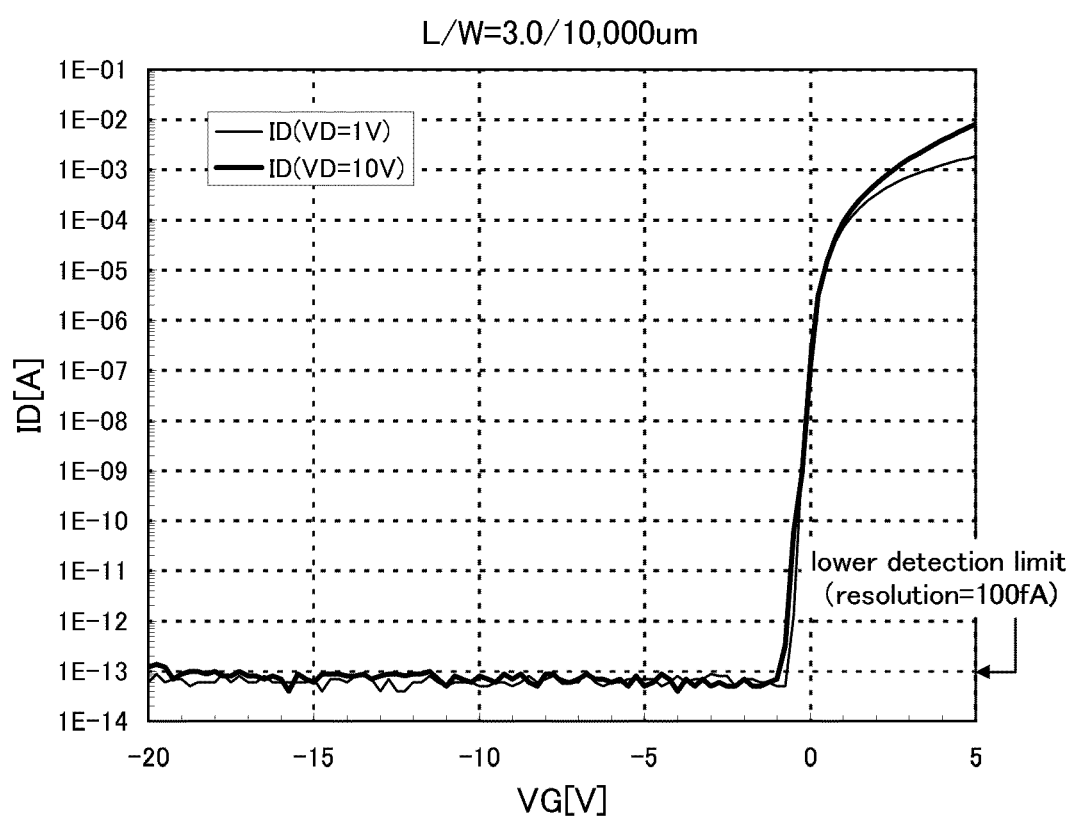
FIG. 6 is a graph illustrating $V_g$-$I_d$ characteristics of a thin film transistor including an oxide semiconductor.
Figure 7A:
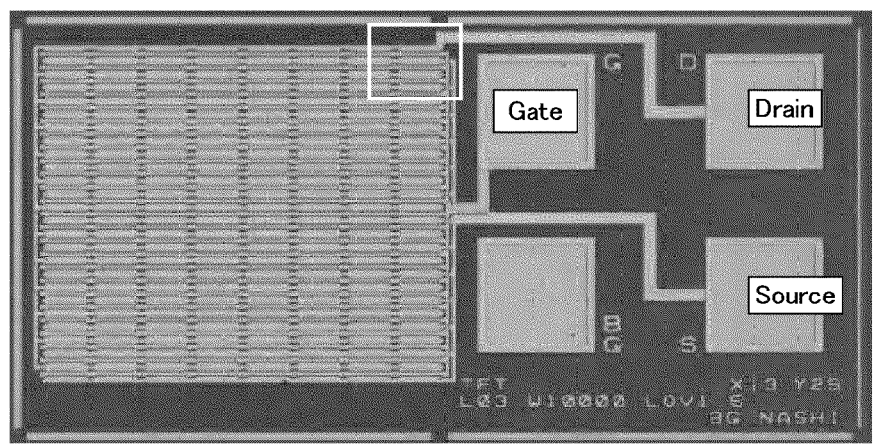
FIGS. 7A and 7B are photographs of a thin film transistor including an oxide semiconductor.
Figure 7B:
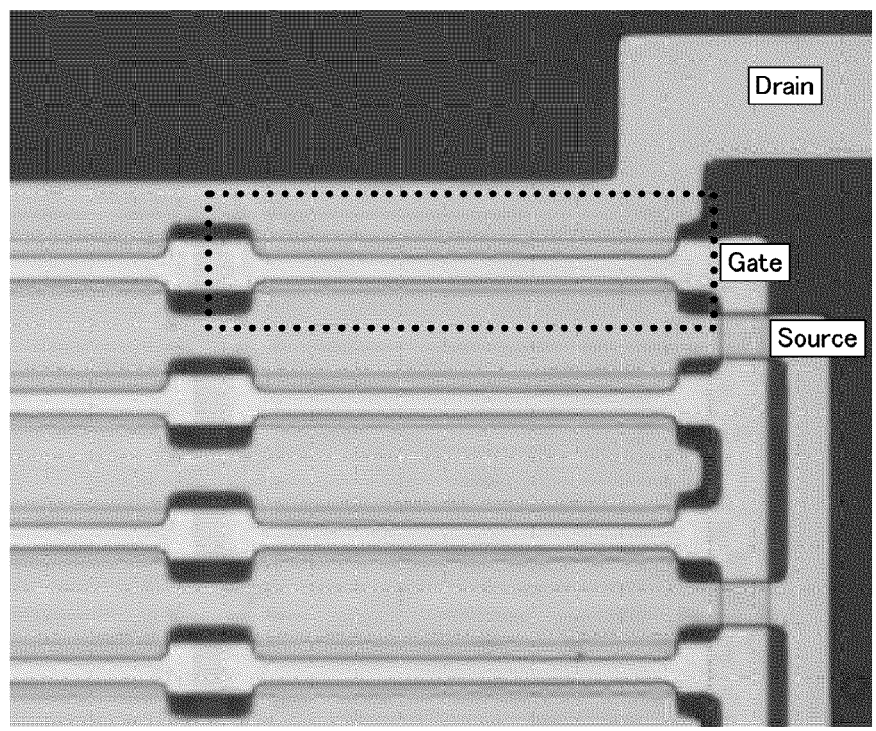

FIG. 6 illustrates initial characteristics of a thin film transistor with L/W=3 µm/10000 µm in which 200 thin film transistors each with L/W=3 µm/50 µm are connected in parallel. In addition, a top view of the thin film transistor is illustrated in FIG. 7A and a partly enlarged top view thereof is illustrated in FIG. 7B. The region enclosed by a dotted line in FIG. 7B is a thin film transistor of one stage with L/W=3 µm/50 µm and $L_{ov}$=1.5 µm. In order to measure the initial characteristics of the thin film transistor, the changing characteristics of source-drain current (hereinafter referred to as drain current or $I_d$) were measured under conditions that the substrate temperature was set to room temperature, source-drain voltage (hereinafter referred to as drain voltage or $V_d$) was set to 10 V, and source-gate voltage (hereinafter referred to as gate voltage or $V_g$) was changed from −20 to +20 V. In other words, $V_g$-$I_d$ characteristics were measured. Note that FIGS. 7A and 7B illustrate $V_g$ in the range of from −20 to +5 V.

As illustrated in FIG. 6, the thin film transistor having a channel width W of 10000 µm has an off-state current of $1\times10^{-13}$ A or less at $V_d$ of 1 V and 10 V, which is less than or equal to the resolution (100 fA) of a measurement device (a semiconductor parameter analyzer, Agilent 4156C manufactured by Agilent Technologies Inc.).

In other words, the thin film transistor has an electrical characteristic of normally off. At a drain voltage of 1 to 10V, the thin film transistor can operate so that off-state current per micrometer of the channel width is 100 aA/µm or less, preferably 10 aA/µm or less, more preferably 1 aA/µm or less.

A method for manufacturing the thin film transistor used for the measurement is described.

First, as a base layer, by CVD, a silicon nitride layer was formed over a glass substrate and a silicon oxynitride layer was formed over the silicon nitride layer. Over the silicon oxynitride layer, a tungsten layer was formed as a gate electrode by sputtering. Here, the tungsten layer was selectively etched so that the gate electrode was formed.

Next, over the gate electrode, a 100-nm-thick silicon oxynitride layer was formed as a gate insulating layer by CVD.

Then, a 50-nm-thick oxide semiconductor layer was formed over the gate insulating layer by sputtering with the use of an In—Ga—Zn—O-based metal oxide target ($In_2O_3$: $Ga_2O_3$:ZnO=1:1:2 in a molar ratio). Here, an island-shaped oxide semiconductor layer was formed by selective etching of the oxide semiconductor layer.

Then, first heat treatment was performed on the oxide semiconductor layer in a clean oven at 450° C. for 1 hour in a nitrogen atmosphere.

Then, as a source electrode and a drain electrode, a 150-nm-thick titanium layer was formed over the oxide semiconductor layer by sputtering. Here, the source electrode and the drain electrode were formed by selective etching of the titanium layer, and 200 thin film transistors each having a channel length L of 3 μm and a channel width W of 50 μm were connected in parallel to obtain a thin film transistor with L/W=3 μm/10000 μm.

Then, as a protective insulating layer, a 300-nm-thick silicon oxide layer was formed so as to be in contact with the oxide semiconductor layer by reactive sputtering. Here, the silicon oxide layer that was the protective layer was selectively etched so that openings were formed over the gate electrode, the source electrode, and the drain electrode. After that, second heat treatment was performed at 250° C. for 1 hour in a nitrogen atmosphere.

Then, heat treatment was performed at 150° C. for 10 hours before the measurement of $V_g$-$I_d$ characteristics.

Through the above steps, a bottom-gate thin film transistor was manufactured.

The reason why the off-state current of the thin film transistor is approximately $1 \times 10^{-13}$ A as illustrated in FIG. 6 is that the concentration of hydrogen in the oxide semiconductor layer can be sufficiently reduced in the above manufacturing steps. The concentration of hydrogen in the oxide semiconductor layer is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower or lower than $1 \times 10^{16}$/cm$^3$. Note that the concentration of hydrogen in the oxide semiconductor layer is measured by secondary ion mass spectroscopy (SIMS).

Although the example where an In—Ga—Zn—O-based oxide semiconductor is used is described, this embodiment is not particularly limited to this. Another oxide semiconductor material, for example, an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, a Zn—O-based oxide semiconductor, or the like can be used. Further, as an oxide semiconductor material, an In—Al—Zn—O-based oxide semiconductor into which Al is mixed at 2.5 to 10 wt % or an In—Zn—O-based oxide semiconductor into which Si is mixed at 2.5 to 10 wt % can be used.

The carrier concentration in the oxide semiconductor layer that is measured by a carrier measurement device is $5 \times 10^{14}$/cm$^3$ or lower, preferably $5 \times 10^{12}$/cm$^3$ or lower, more preferably lower than or equal to a carrier concentration of silicon, $1.45 \times 10^{10}$/cm$^3$. That is, the carrier concentration in the oxide semiconductor layer can be as close to zero as possible.

Further, the channel length L of the thin film transistor can be 10 to 1000 nm, and a circuit can operate at higher speed. Furthermore, since the amount of off-state current is extremely small, power consumption can be further reduced.

In circuit design, the oxide semiconductor layer can be regarded as an insulator when the thin film transistor is off.

After that, the temperature characteristics of off-state current of the thin film transistor manufactured in this embodiment were evaluated. The temperature characteristics are important in considering the environmental resistance, maintenance of performance, or the like of an end product in which the thin film transistor is used. It is to be understood that a smaller amount of change is preferable, which increases the degree of freedom for product design.

For the temperature characteristics, the $V_g$-$I_d$ characteristics were obtained using a constant-temperature chamber under conditions that substrates provided with thin film transistors were kept at respective constant temperatures of −30° C., 0° C., 25° C., 40° C., 60° C., 80° C., 100° C., and 120° C., drain voltage was set to 6 V, and gate voltage was changed from −20 to +20 V.

Figure 8A:
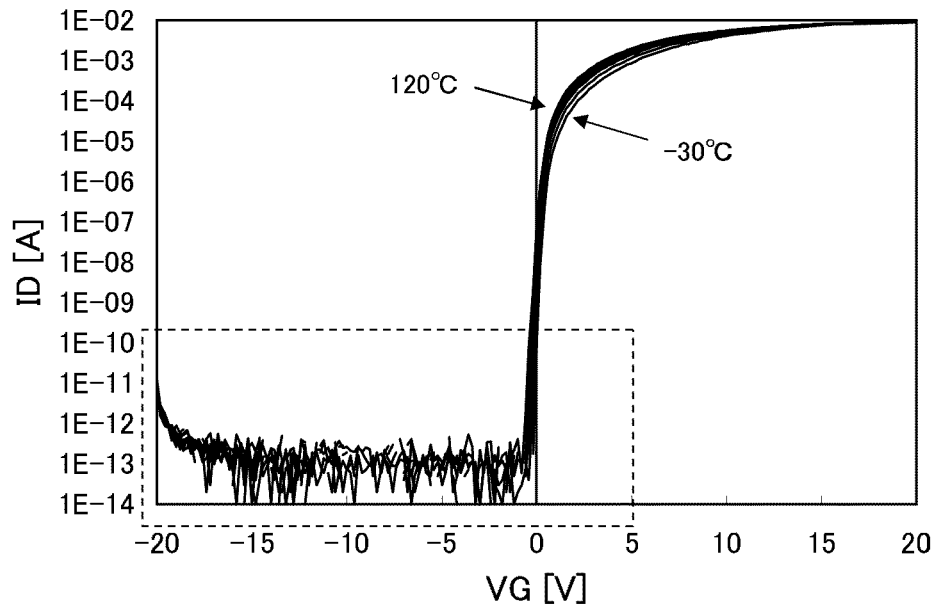
FIGS. 8A and 8B are graphs illustrating $V_g$-$I_d$ characteristics (temperature characteristics) of a thin film transistor including an oxide semiconductor.
Figure 8B:
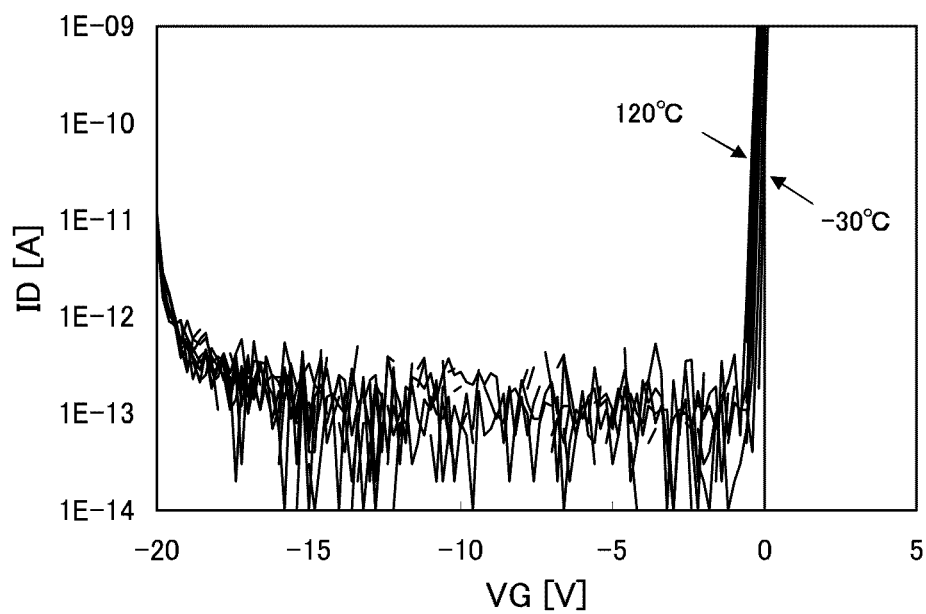

FIG. 8A illustrates $V_g$-$I_d$ characteristics measured at the above temperatures and superimposed on one another, and FIG. 8B illustrates an enlarged view of the range of off-state current enclosed by a dotted line in FIG. 8A. The rightmost curve indicated by an arrow in the diagram is a curve obtained at −30° C.; the leftmost curve is a curve obtained at 120° C.; and curves obtained at the other temperatures are located therebetween. The temperature dependence of on-state current can hardly be observed. On the other hand, as clearly illustrated also in the enlarged view of FIG. 8B, the off-state current is $1 \times 10^{-12}$ A or less, which is near the resolution of the measurement device, at all the temperatures except the case where the gate voltage is around 20 V, and the temperature dependence thereof is not observed. In other words, even at a high temperature of 120° C., the off-state current is kept at $1 \times 10^{-12}$ A or less, and given that the channel width W is 10000 μm, it can be seen that the off-state current is significantly low.

A thin film transistor including a highly purified oxide semiconductor shows almost no dependence of off-state current on temperature. It can be said that an oxide semiconductor does not show temperature dependence when highly purified because the conductivity type becomes extremely close to an intrinsic type and the Fermi level is located in the middle of the forbidden band, as illustrated in the band diagram of FIG. 10A. This also results from the fact that the oxide semiconductor has an energy gap of 3 eV or more and includes very few thermally excited carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off-state current from temperature) can be explained by independence of carrier density from temperature. Further, this extremely low off-state current is described below with reference to band diagrams.

Figure 9:
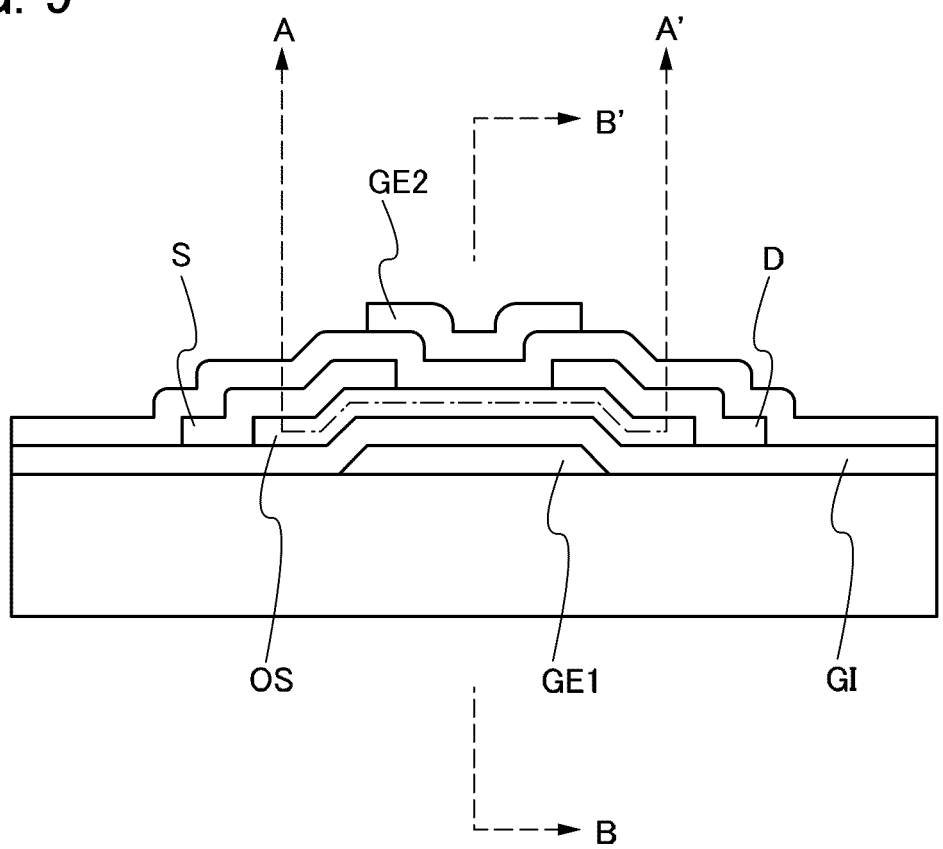
FIG. 9 is a longitudinal cross-sectional view of an inverted staggered thin film transistor including an oxide semiconductor.

FIG. 9 is a longitudinal cross-sectional view of an inverted staggered thin film transistor including an oxide semiconductor. An oxide semiconductor layer (OS) is provided over a gate electrode (GE1) with a gate insulating film (GI) provided therebetween. A source electrode (S) and a drain electrode (D) are provided thereover.

Figure 10A:
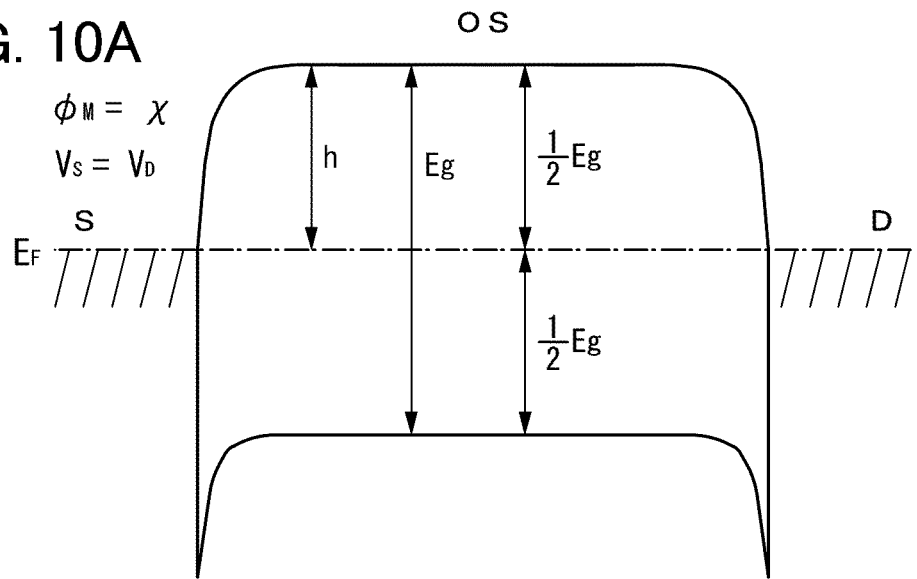
FIGS. 10A and 10B are energy band diagrams (schematic views) in an A-A' cross section in FIG. 9.
Figure 10B:
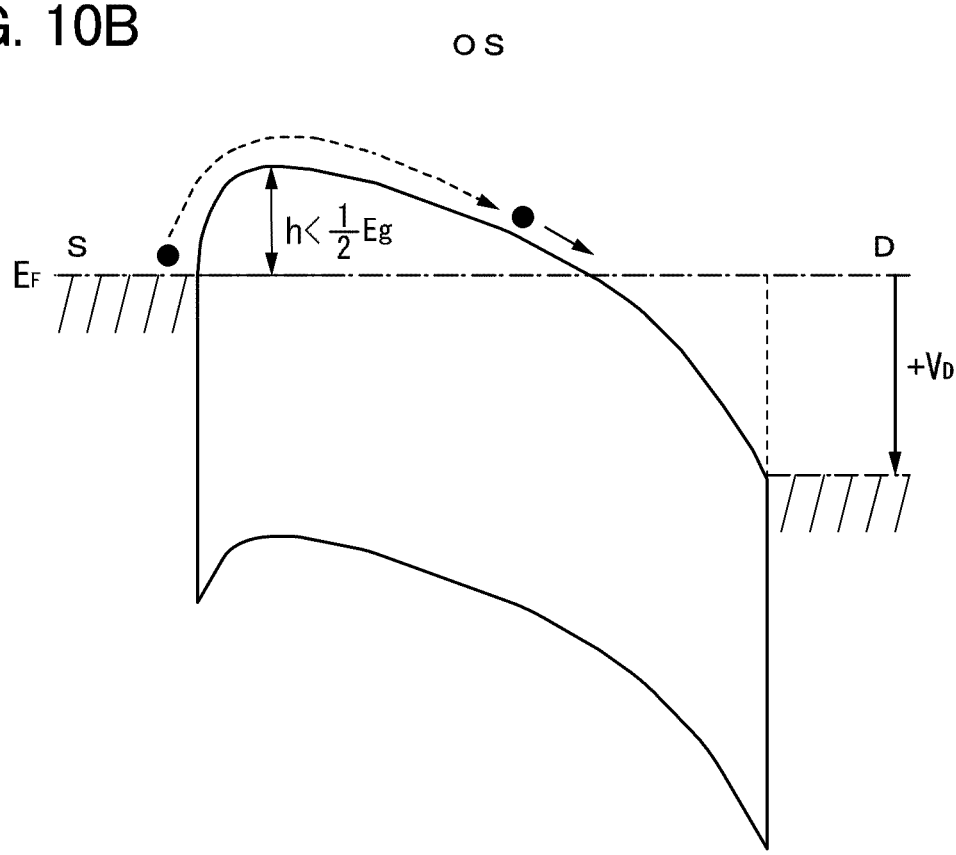

FIGS. 10A and 10B are energy band diagrams (schematic views) in an A-A' cross section in FIG. 9. FIG. 10A illustrates the case where the voltage of a source and the voltage of a drain are equal ($V_D=0$ V), and FIG. 10B illustrates the case where a positive potential ($V_D>0$ V) is applied to the drain.

Figure 11A:
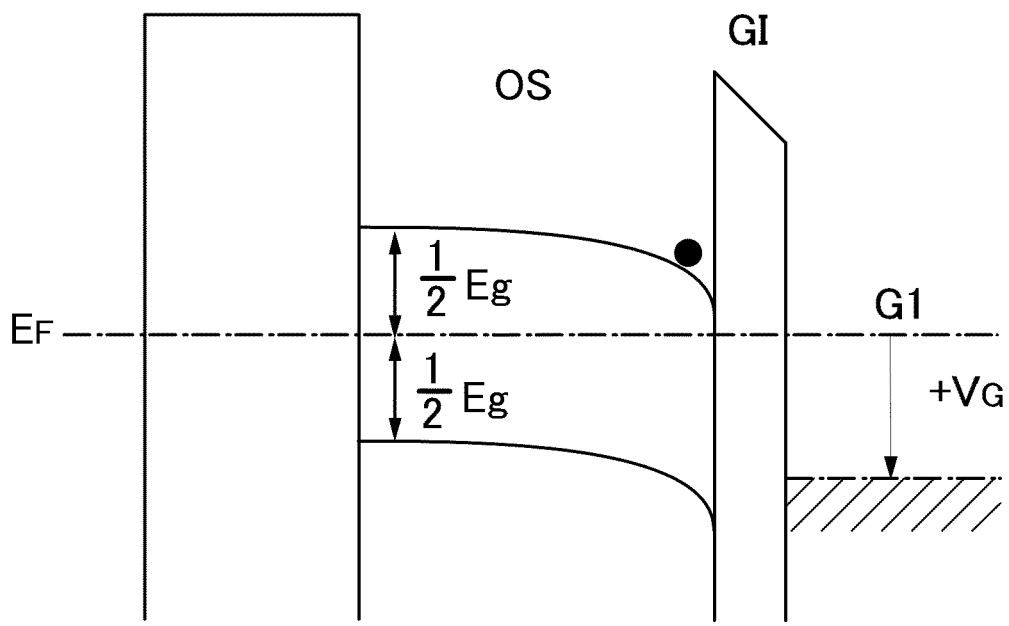
FIG. 11A is an energy band diagram (a schematic view) in a B-B' cross section in FIG. 9 that illustrates a state in which a positive potential (+VG) is applied to a gate (G1)
Figure 11B:
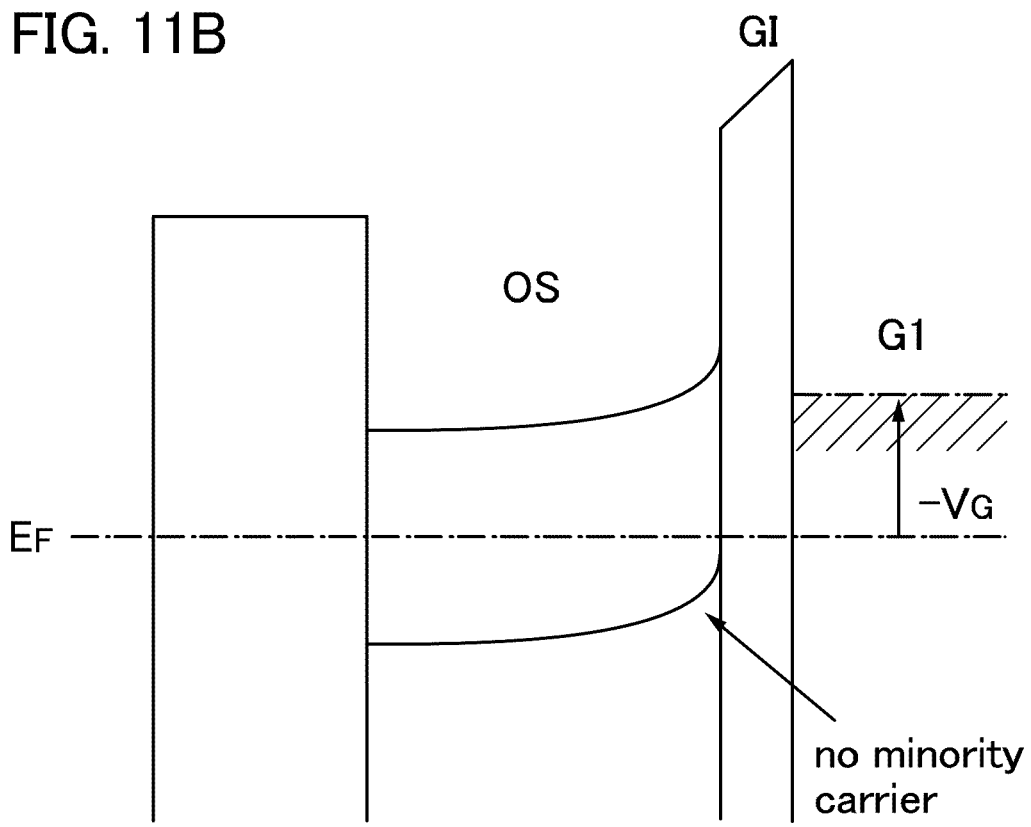
FIG. 11B is an energy band diagram (a schematic view) in the B-B' cross section in FIG. 9 that illustrates a state in which a negative potential (−VG) is applied to the gate (G1)

FIGS. 11A and 11B are energy band diagrams (schematic views) in a B-B' cross section in FIG. 9. FIG. 11A illustrates a state in which a positive potential ($+V_G$) is applied to a gate (G1) and carriers (electrons) flow between a source and a drain. Further, FIG. 11B illustrates a state in which a negative potential ($-V_G$) is applied to the gate (G1) and the thin film transistor is off (minority carriers do not flow).

Figure 12:
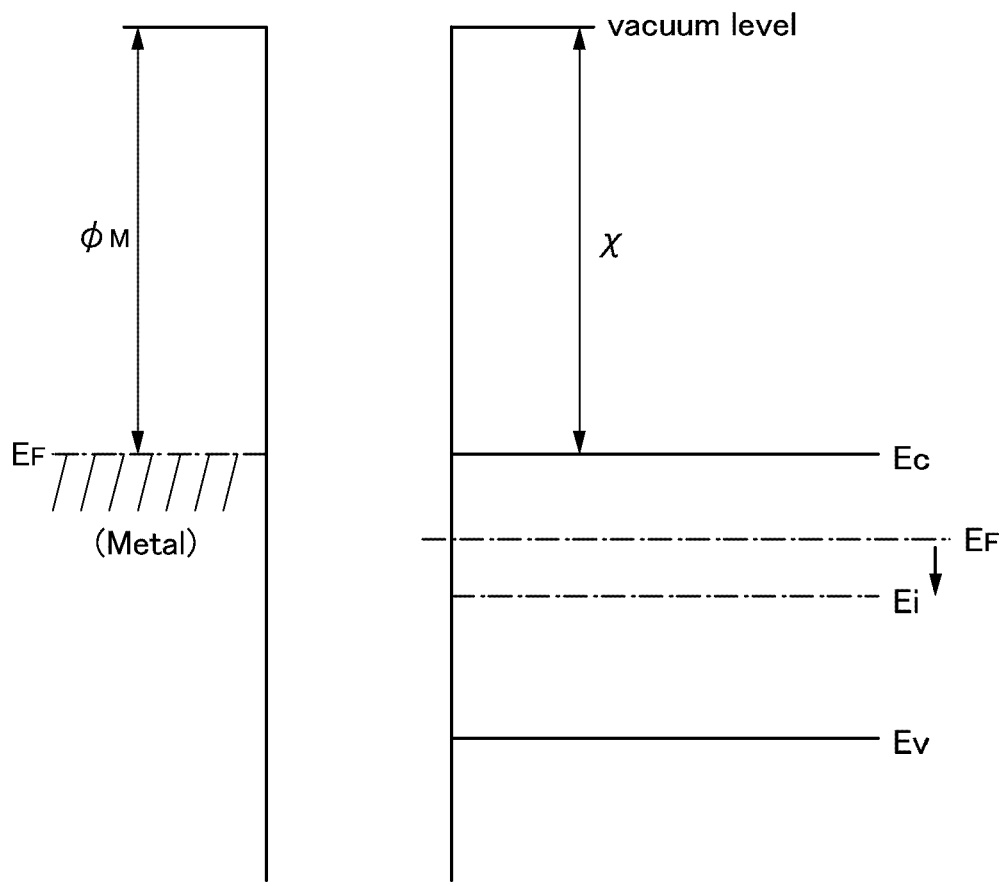
FIG. 12 illustrates a relationship among a vacuum level, a work function ($\phi M$) of a metal, and electron affinity ($\chi$) of an oxide semiconductor.

FIG. 12 illustrates a relationship among a vacuum level, the work function ($\phi_M$) of a metal, and electron affinity ($\chi$) of an oxide semiconductor.

A conventional oxide semiconductor generally has n-type conductivity, and the Fermi level ($E_F$) in that case is apart from the intrinsic Fermi level ($E_i$) positioned in the middle of the band gap and is positioned near the conduction band. Note that it is known that part of hydrogen in an oxide semiconductor serves as a donor and is a factor which makes the oxide semiconductor have n-type conductivity.

In contrast, the oxide semiconductor in one embodiment of the present invention is an intrinsic (i-type) or substantially intrinsic oxide semiconductor obtained by removal of hydrogen, which is an n-type impurity, from the oxide semiconductor and the increase in purity so that an impurity other than the main components of the oxide semiconductor is not included as much as possible. In other words, the oxide semiconductor is a highly purified intrinsic (i-type) semiconductor or a semiconductor which is close to a highly purified i-type semiconductor not by addition of an impurity but by removal of an impurity such as hydrogen or water as much as possible. In this manner, the Fermi level ($E_F$) can be the same level as the intrinsic Fermi level ($E_i$).

It is said that in the case where the band gap (Eg) of the oxide semiconductor is 3.15 eV, electron affinity ($\chi$) is 4.3 eV. The work function of titanium (Ti) used for the source electrode and the drain electrode is substantially the same as the electron affinity ($\chi$) of the oxide semiconductor. In this case, the Schottky electron barrier is not formed at an interface between the metal and the oxide semiconductor.

In other words, in the case where the work function ($\phi_M$) of the metal is the same as the electron affinity ($\chi$) of the oxide semiconductor, a state in which the metal and the oxide semiconductor are in contact with each other is shown as an energy band diagram (a schematic view) illustrated in FIG. 10A.

In FIG. 10B, a black circle (●) indicates an electron. When a positive potential is applied to the drain, the electron is injected into the oxide semiconductor over the barrier (h) and flows toward the drain. In that case, the height of the barrier (h) changes depending on the gate voltage and the drain voltage; in the case where positive drain voltage is applied, the height of the barrier (h) is smaller than the height of the barrier in FIG. 10A where no voltage is applied, i.e., half of the band gap (Eg).

The electrons injected into the oxide semiconductor at this time flow through the oxide semiconductor, as illustrated in FIG. 11A. Further, in FIG. 11B, holes that are minority carriers are substantially zero when a negative potential is applied to the gate (G1); thus, almost no current flows.

For example, even in the case of a thin film transistor whose channel width W is $1\times10^4$ µm and whose channel length L is 3 µm, off-state current at room temperature is $10^{-13}$ A or less and a subthreshold swing (an S value) is 0.1 V/dec (the thickness of the gate insulating film is 100 nm).

The intrinsic carrier concentration of a silicon semiconductor is $1.45\times10^{10}/cm^3$ (300 K) and carriers exist even at room temperature. This means that thermally excited carriers exist even at room temperature. Further, the band gap of the silicon semiconductor is 1.12 eV; thus, the off-state current of a transistor including a silicon semiconductor significantly changes depending on temperature.

Therefore, not by simply using an oxide semiconductor having a wide band gap for a transistor but by highly purifying the oxide semiconductor so that an impurity other than the main components of the oxide semiconductor is not included as much as possible. Thus, in such an oxide semiconductor, the carrier concentration becomes $1\times10^{14}/cm^3$ or lower, preferably $1\times10^{12}/cm^3$ or lower, so that carriers to be thermally excited at a practical operation temperature are hardly included and the transistor can operate only with electrons injected from the source side. This makes it possible to decrease the off-state current to $1\times10^{-13}$ A or less and to obtain an extremely stable transistor whose off-state current hardly changes with a change in temperature.

A technical idea of one embodiment of the present invention is that an impurity is not added to an oxide semiconductor and the oxide semiconductor itself is highly purified by removal of an impurity such as water or hydrogen which undesirably exists therein. In other words, a feature of one embodiment of the present invention is that an oxide semiconductor itself is highly purified by removal of water or hydrogen which forms a donor level and by supply of oxygen to the oxide semiconductor which is made to be in an oxygen-deficient state at the time of removal.

In an oxide semiconductor, even right after the deposition, hydrogen is observed on the order of $10^{20}/cm^3$ by secondary ion mass spectroscopy (SIMS). One technical idea of the present invention is to highly purify an oxide semiconductor and to obtain an electrically i-type (intrinsic) semiconductor by intentional removal of an impurity such as water or hydrogen which forms a donor level and by compensation for lack of oxygen that is generated at the time of removal.

As a result, it is preferable that the amount of hydrogen be as small as possible, and it is also preferable that the number of carriers in the oxide semiconductor be as small as possible. The oxide semiconductor is a so-called highly purified i-type (intrinsic) semiconductor from which carriers are eliminated and which functions as a path of carriers (electrons) supplied from a source, rather than intentionally including carriers for flowing current when used for a thin film transistor.

As a result, by eliminating carriers from an oxide semiconductor or significantly reducing carries therein, the off-state current of a TFT can be decreased, which is a technical idea of one embodiment of the present invention. In other words, as a criterion, the concentration of hydrogen should be $5\times10^{19}/cm^3$ or lower, preferably $5\times10^{18}/cm^3$ or lower, more preferably $5\times10^{17}/cm^3$ or lower or lower than $1\times10^{16}/cm^3$. The carrier concentration should be lower than $1\times10^{14}/cm^3$, preferably $1\times10^{12}/cm^3$ or lower.

In addition, as a result, the oxide semiconductor functions as a path, the oxide semiconductor itself is an i-type (intrinsic) semiconductor which is highly purified so as not to supply carriers or to supply almost no carrier, and carriers are supplied from a source and a drain.

Therefore, it is preferable that off-state current be as low as possible, and as characteristics of a transistor to which a drain voltage in the range of from 1 to 10 V is applied, the off-state current is 100 aA/µm or less (the channel width W=current per micrometer), preferably 10 aA/µm or less, more preferably 1 aA/µm or less.

In the case where a memory circuit (a memory element) or the like is formed using such a thin film transistor having extremely low off-state current, there is very little leakage. Therefore, a potential can be held for a long time and data stored can be held for a long time.

This embodiment can be combined with any of the structures described in the other embodiments as appropriate.

(Embodiment 3)

The operation of a solid-state image sensor including a thin film transistor in one embodiment of the present invention is described.

A CMOS (complementary metal oxide semiconductor) image sensor, which is a solid-state image sensor, holds a potential in a signal charge storage portion and outputs the potential to a vertical output line through an amplifier transistor. In a general CMOS image sensor, when leakage current occurs in a reset transistor and/or a transfer transistor, charge or discharge is generated due to the leakage current, so that the potential of the signal charge storage portion is changed. When the potential of the signal charge storage portion is changed, the potential of the amplifier transistor is also changed; thus, the levels of the potentials are deviated from the original potentials and an image taken deteriorates, which is problematic.

In this embodiment, the effect of the case where the thin film transistor described in Embodiments 1 and 2 is used as a transfer transistor in a CMOS image sensor is described. Note that as described in Embodiment 1, provision of a reset transistor can be omitted in one embodiment of the present invention. Further, either a thin film transistor or a bulk transistor may be used as an amplifier transistor.

Figure 29:
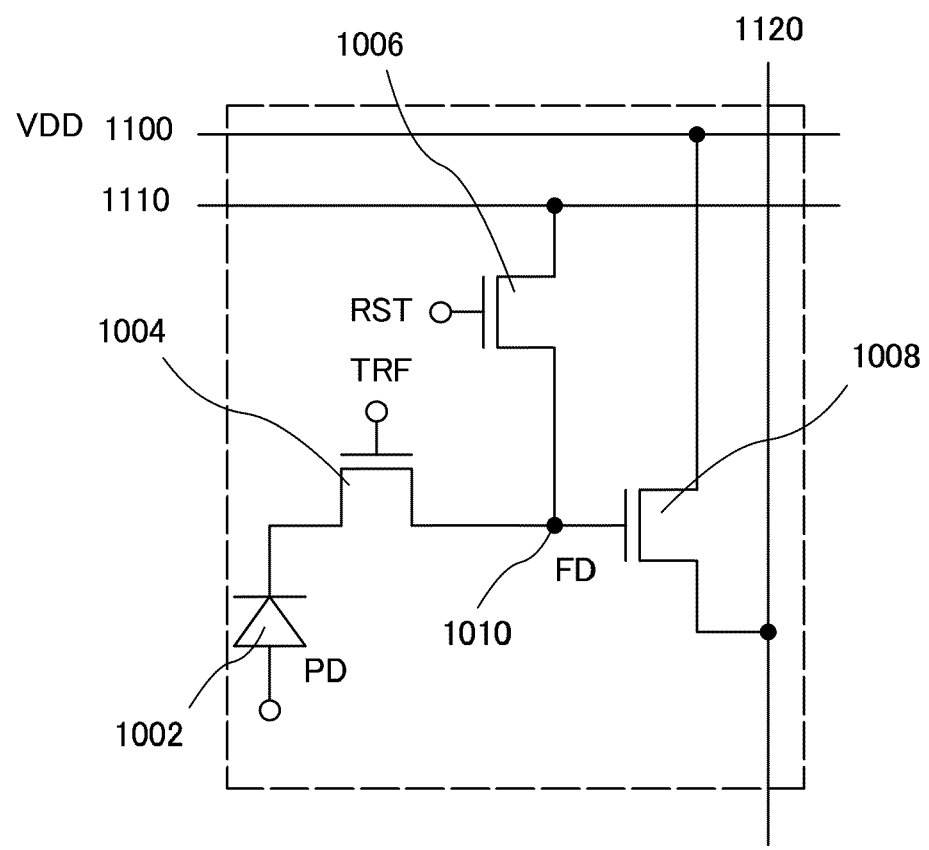
FIG. 29 illustrates a structure of a pixel of a solid-state image sensor.

FIG. 29 illustrates an example of the pixel structure of a conventional CMOS image sensor. A pixel includes a photodiode 1002 which is a photoelectric conversion element, a transfer transistor 1004, a reset transistor 1006, an amplifier transistor 1008, and a variety of wirings. A plurality of pixels are arranged in matrix to form a sensor.

Here, the photodiode 1002 is connected to the source side of the transfer transistor 1004. A signal charge storage portion 1010 (also referred to as a floating diffusion (FD)) is formed on the drain side of the transfer transistor 1004. A source of the reset transistor 1006 and a gate of the amplifier transistor 1008 are connected to the signal charge storage portion 1010. As another structure, the selection transistor might be connected to the amplifier transistor.

Figure 30:
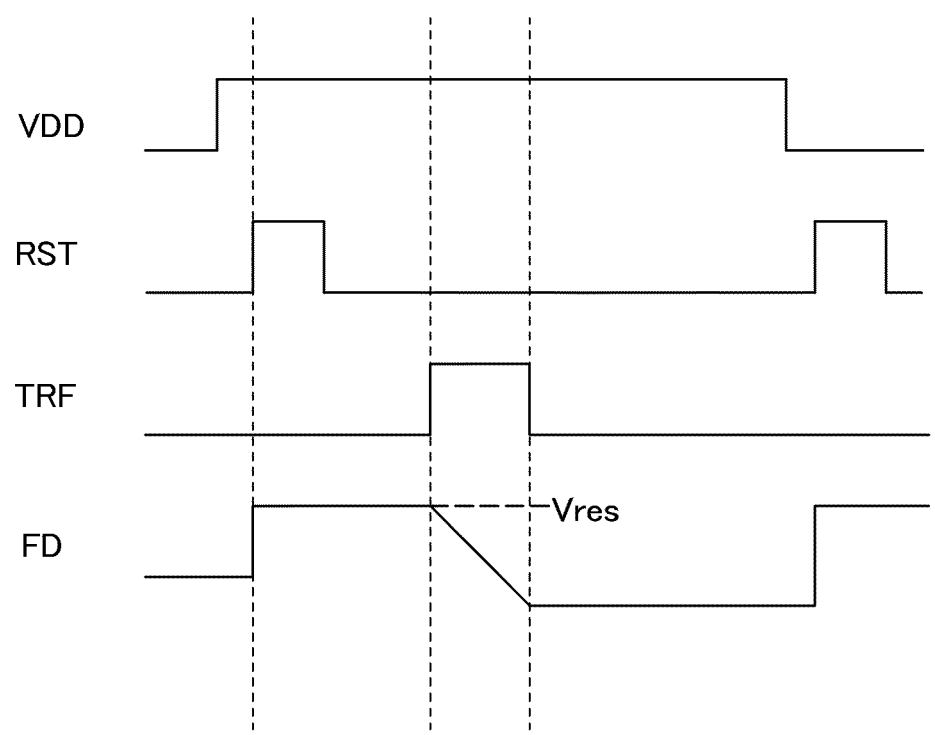
FIG. 30 illustrates operation of the pixel of the solid-state image sensor.

Next, the operation is described with reference to a timing chart in FIG. 30. First, power supply voltage is supplied to a power supply terminal. Then, a reset pulse is input to a gate of the reset transistor 1006, so that the reset transistor 1006 is turned on. A reset power supply potential is stored in the signal charge storage portion 1010. Then, the reset transistor 1006 is turned off, and the signal charge storage portion 1010 is held at the reset power supply potential. Next, when the transfer transistor 1004 is turned on, current flows from the signal charge storage portion 1010 to the photodiode, so that the potential of the signal charge storage portion 1010 is lowered. When the transfer transistor 1004 is turned off, a potential when the transfer transistor 1004 is turned off is held in the signal charge storage portion 1010. Then, the potential is output to a vertical output line 1120 through the amplifier transistor 1008. After that, the supply of power supply voltage to the power supply terminal is interrupted. In this manner, a signal is output.

Figure 13:
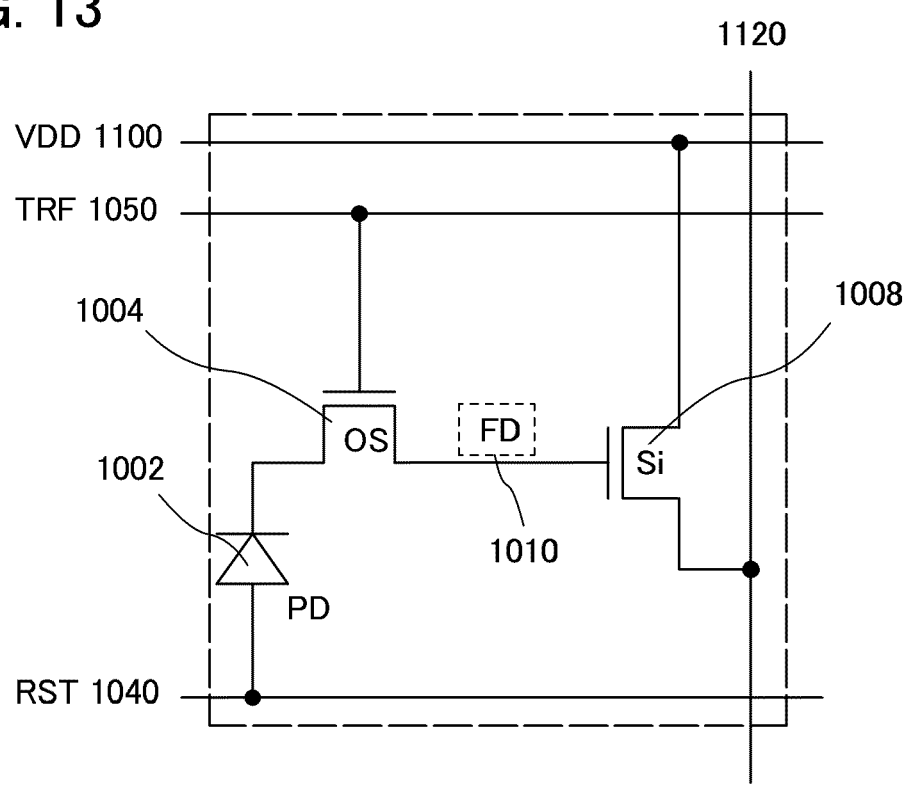
FIG. 13 illustrates a structure of a pixel of a solid-state image sensor.

FIG. 13 illustrates an example of the pixel structure of a CMOS image sensor in one embodiment of the present invention. A pixel includes the photodiode 1002 which is a photoelectric conversion element, the transfer transistor 1004, the amplifier transistor 1008, and a variety of wirings. A plurality of pixels are arranged in matrix to form a sensor. Further, a selection transistor which is electrically connected to the amplifier transistor 1008 may be provided. In one embodiment of the present invention, provision of a reset transistor is omitted.

Here, the photodiode 1002 is connected to the source side of the transfer transistor 1004. The signal charge storage portion 1010 is formed on the drain side of the transfer transistor 1004. The gate of the amplifier transistor 1008 is connected to the signal charge storage portion 1010.

Figure 14:
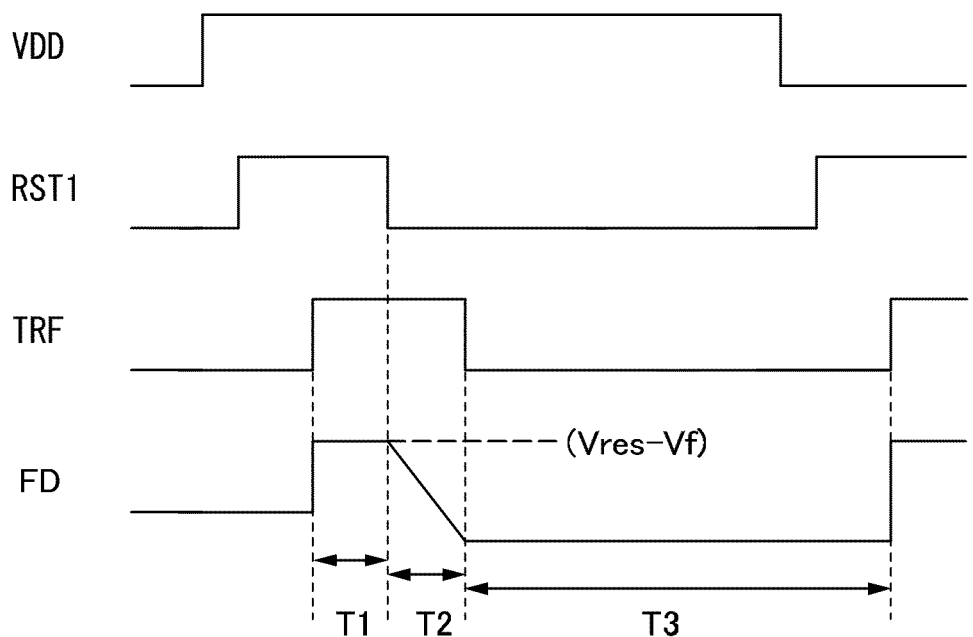
FIG. 14 illustrates operation of the pixel of the solid-state image sensor.

Next, the operation is described with reference to a timing chart in FIG. 14. First, power supply voltage is supplied to a power supply terminal. Then, when the potential (RST1) of a reset signal line 1040 becomes a high level, a forward bias is applied to the photodiode 1002, and the potential of a cathode of the photodiode 1002 is lower than the high-level potential of the reset signal line by the forward voltage ($V_f$) of the photodiode 1002. Then, when the potential of a transfer switch line 1050 becomes a high level and the transfer transistor 1004 is turned on, the potential (FD) of the signal charge storage portion 1010 is the same as the potential of the cathode of the photodiode 1002 (a period T1). Then, when the potential (RST1) of the reset signal line 1040 becomes a low level, the potential of an anode of the photodiode 1002 becomes a low level, so that a reverse bias is applied to the photodiode 1002. Here, current corresponding to light which enters the photodiode 1002 flows to the photodiode 1002 and the transfer transistor 1004, so that the potential of the signal charge storage portion 1010 is lowered (a period T2). When the potential of the transfer switch line 1050 becomes a low level and the transfer transistor 1004 is turned off, a potential when the transfer transistor 1004 is turned off is held in the signal charge storage portion 1010 (a period T3). Here, when almost no leakage current flows to the transfer transistor 1004, the potential (FD) of the signal charge storage portion 1010 is held until the next operation of the transistor starts. Then, the potential is output to the vertical output line 1120 through the amplifier transistor 1008. After that, the supply of power supply voltage to the power supply terminal is interrupted. In this manner, a signal is output.

In other words, the operation can be performed without provision of a reset transistor; almost no leakage current flows from the signal charge storage portion 1010 through the thin film transistor when the thin film transistor including an oxide semiconductor whose off-state current is significantly low that is described in Embodiments 1 and 2 is used as the transfer transistor 1004; and the potential can be held for a very long time in a holding period in the period T3.

Figure 15:
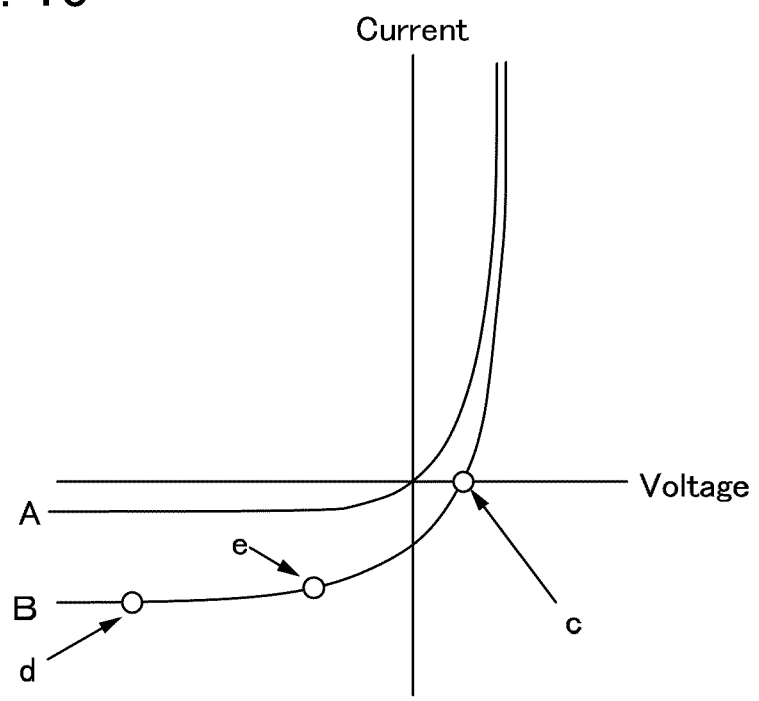
FIG. 15 illustrates operation of a photodiode.

Next, the operation of the photodiode 1002 is described with reference to FIG. 15. When light does not enter the photodiode, the photodiode has the same voltage-current characteristics as a normal diode (a curve A in FIG. 15). When light enters the photodiode, a larger amount of current flows especially when a reverse bias is applied, as compared to the case where light does not enter the photodiode (a curve B in FIG. 15). The movement of the operating point of the photodiode is described with reference to the operation in the pixel illustrated in FIG. 13. When the reset signal line 1040 and the transfer transistor 1004 are in an off state, a path for flowing current does not exist in the photodiode 1002; thus, the cathode of the photodiode 1002 is positioned at a point c in FIG. 15 even when light enters the photodiode. When the potential of the reset signal line 1040 becomes a high level, a forward bias is applied to the photodiode 1002, and the potential of the cathode of the photodiode is lower than a reset potential by the forward voltage of the photodiode. When the transfer transistor 1004 is turned on, the potential of the signal charge storage portion 1010 is the same as the potential of the cathode of the photodiode 1002. Here, when the potential of the reset signal line 1040 becomes a low level, a reverse bias is applied to the photodiode 1002, and the cathode of the photodiode 1002 is positioned at a point d in FIG. 15. Then, when light enters the photodiode 1002, discharge current flows from the signal charge storage portion 1010 through the transfer transistor 1004, so that the potential of the signal charge storage portion 1010 is lowered. When the transfer transistor 1004 is turned off, discharge is stopped. When it is assumed that the operating point at this time in FIG. 15 is denoted by e, a potential difference between the operating point d and the operating point e corresponds to a potential difference of a signal obtained by discharge of the photodiode 1002.

Figure 16:
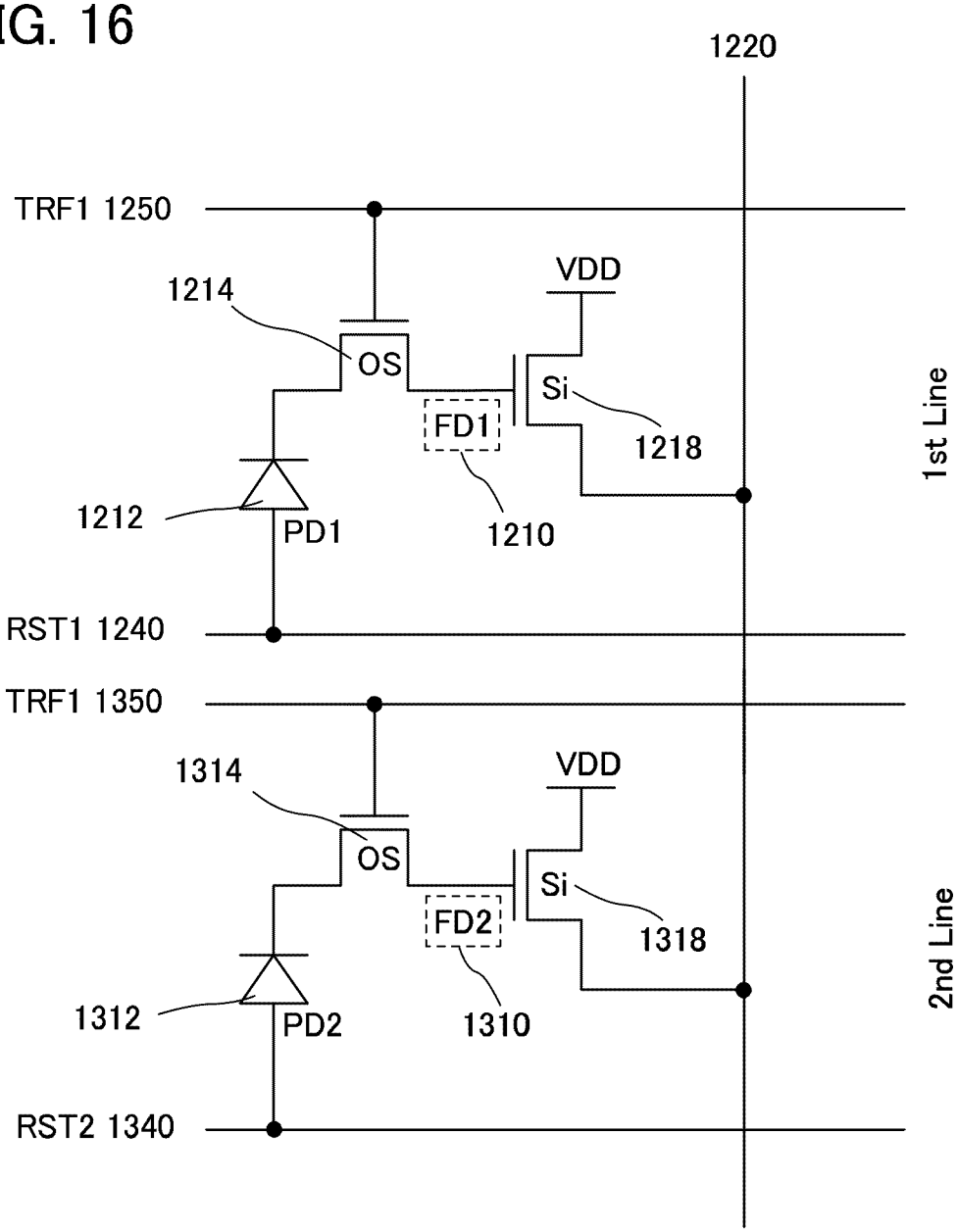
FIG. 16 illustrates structures of pixels of solid-state image sensors.

Next, operation when an amplifier transistor and signal lines are used in common among a plurality of pixels is described. FIG. 16 is a basic structure where one transfer transistor, one amplifier transistor, one photodiode are provided in each pixel and a reset signal line, a transfer switch line, and a vertical output line are connected to the pixel.

Figure 17:
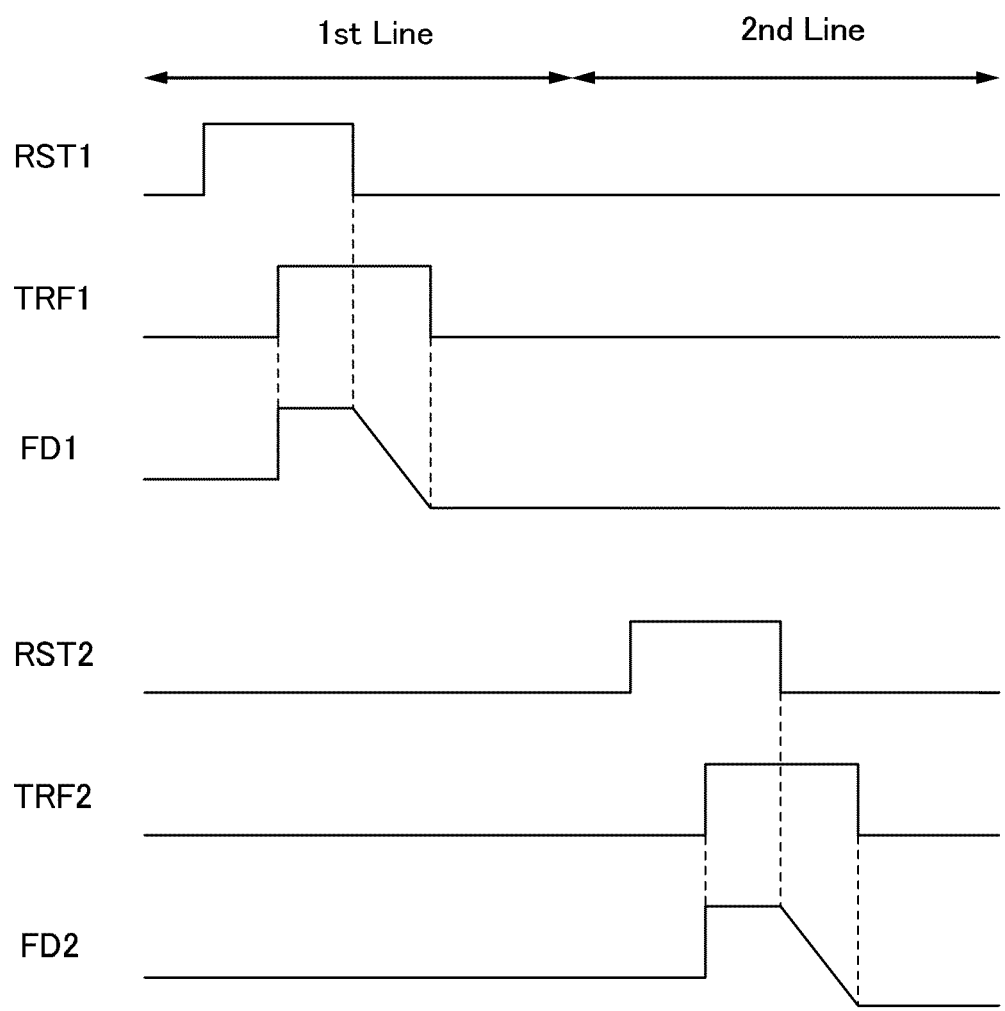
FIG. 17 illustrates operation of the pixels of the solid-state image sensors.

The operation in the basic structure is described with reference to a timing chart in FIG. 17. In driving of a first line, first, when the potential (RST1) of a first reset signal line 1240 becomes a high level, a forward bias is applied to a first photodiode 1212, and the potential of a cathode of the first photodiode 1212 is lower than the high-level potential of the first reset signal line 1240 by the forward voltage ($V_f$) of the photodiode. Then, when the potential (TRF1) of a first transfer switch line 1250 becomes a high level, a first transfer transistor 1214 is turned on, so that the potential (FD) of a signal charge storage portion 1210 is the same as the potential of the cathode of the first photodiode 1212. Next, when the potential (RST1) of the first reset signal line 1240 becomes a low level, the potential of an anode of the photodiode becomes a low level. At this time, a reverse bias is applied to the first photodiode 1212. Here, current corresponding to light which enters the first photodiode 1212 flows to the first photodiode 1212 and the first transfer transistor 1214, so that the potential (FD) of the signal charge storage portion 1210 is lowered by discharge. When the potential (TRF1) of the first transfer switch line 1250 becomes a low level, the first transfer transistor 1214 is turned off, so that the potential (FD) of the signal charge storage portion 1210 is held because a current path is interrupted. This potential is output to a vertical output line 1220 through a first amplifier transistor 1218. Then, driving of a second line is performed. In this manner, sequential driving is performed.

Figure 18:
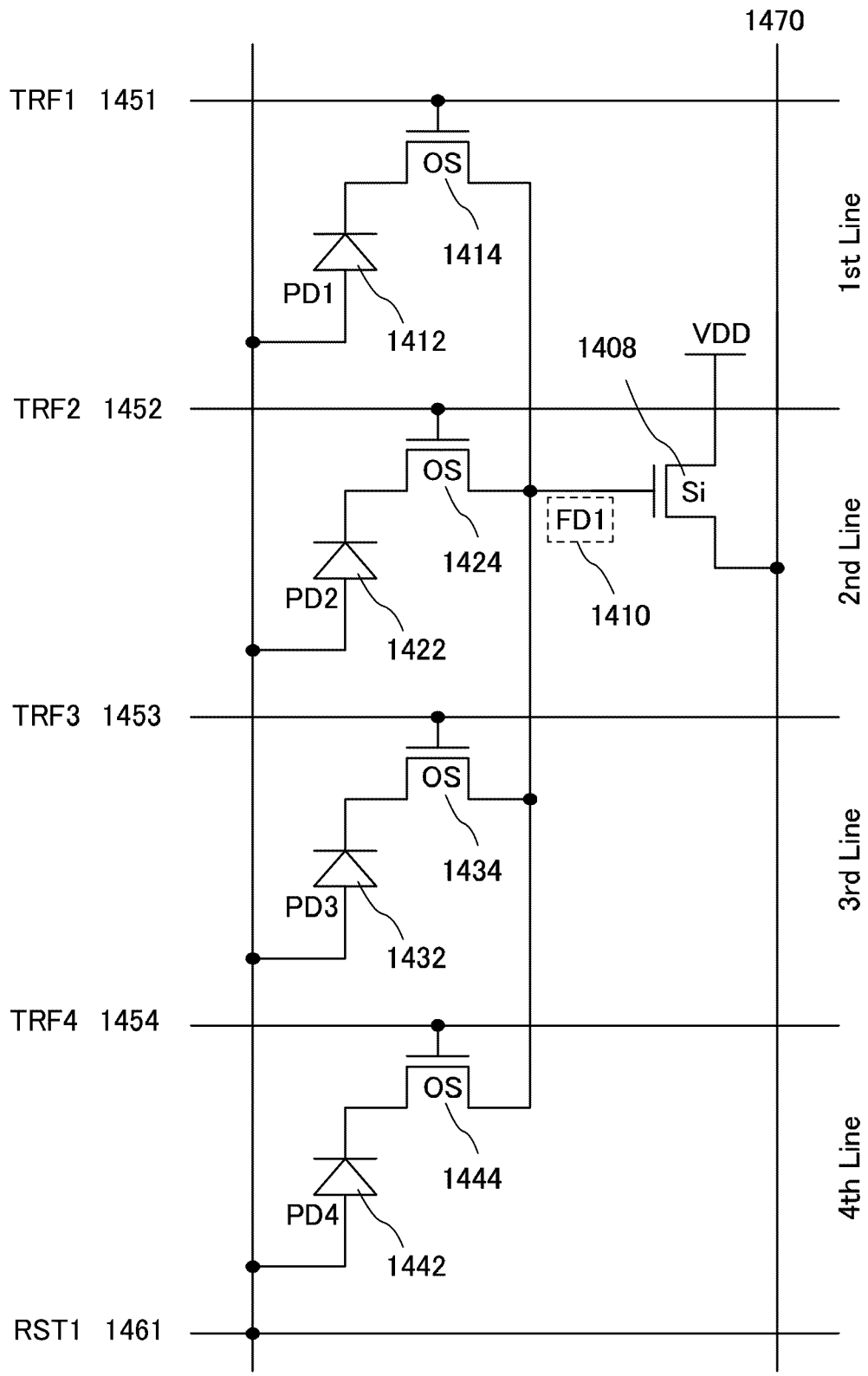
FIG. 18 illustrates structures of pixels of solid-state image sensors.

Unlike the above basic structure, FIG. 18 illustrates the structures of four pixels arranged longitudinally, where an amplifier transistor and a reset signal line are used in common. When the number of transistors and the number of wirings are reduced, miniaturization due to the decrease in the pixel area and reduction in noise due to the increase in the light reception area of a photodiode can be realized. Drains of transfer transistors in the four pixels arranged longitudinally are electrically connected to each other, so that a signal charge storage portion 1410 is formed. A gate of an amplifier transistor 1408 is connected to the signal charge storage portion 1410.

Figure 19:
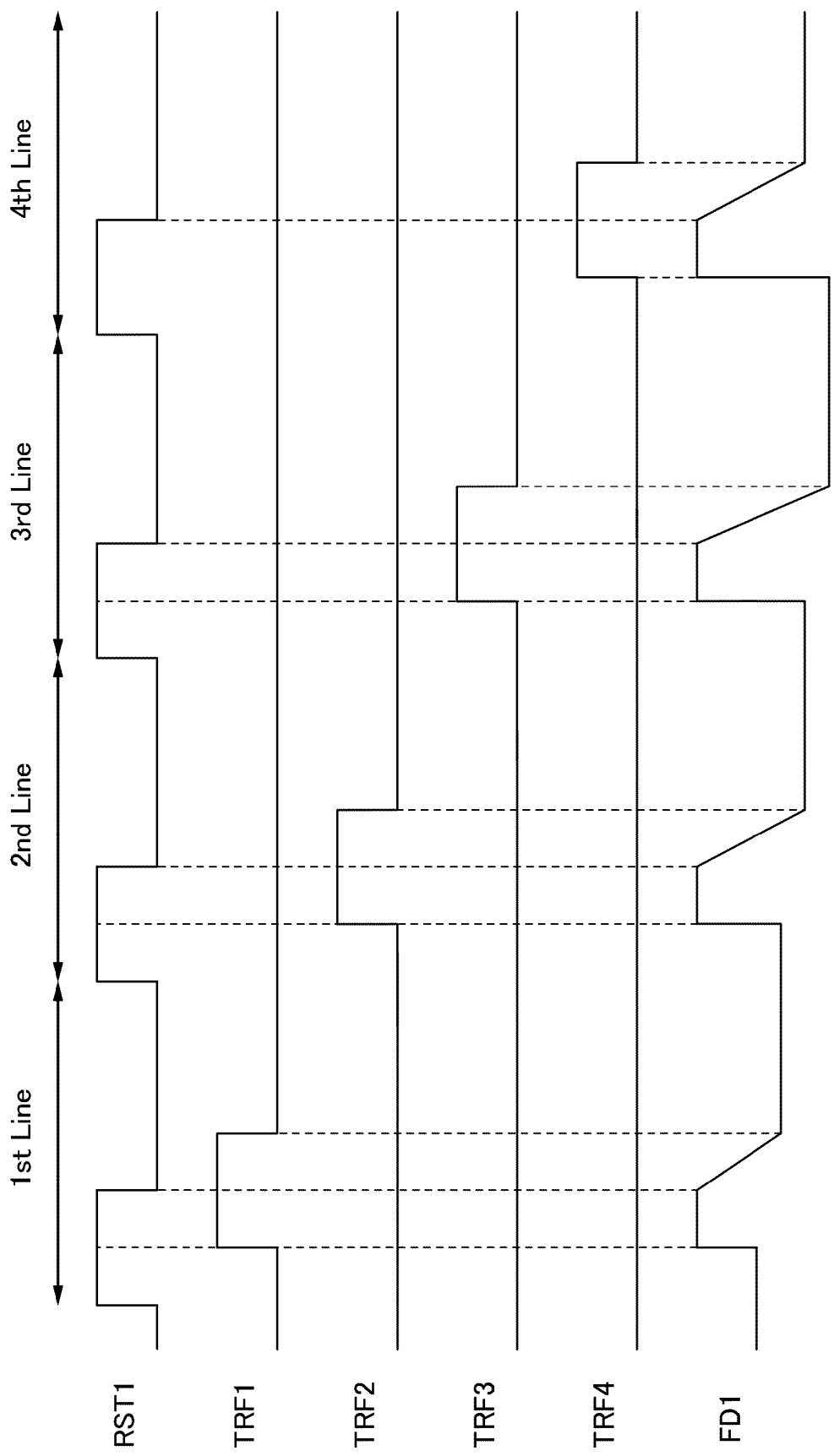
FIG. 19 illustrates operation of the pixels of the solid-state image sensors.

The operation in the structures of four pixels arranged longitudinally is described with reference to a timing chart in FIG. 19. In driving of a first line, first, when the potential (RST1) of a first reset signal line 1461 becomes a high level, a forward bias is applied to a first photodiode 1412, and the potential of a cathode of the first photodiode 1412 is lower than the high-level potential of the first reset signal line 1461 by the forward voltage ($V_f$) of the photodiode. Then, when the potential (TRF1) of a first transfer switch line 1451 becomes a high level, a first transfer transistor 1414 is turned on, so that the potential (FD1) of the signal charge storage portion 1410 is the same as the potential of the cathode of the first photodiode 1412. Next, when the potential (RST1) of the first reset signal line 1461 becomes a low level, the potential of an anode of the photodiode becomes a low level. At this time, a reverse bias is applied to the first photodiode 1412. Here, current corresponding to light which enters the first photodiode 1412 flows to the first photodiode 1412 and the first transfer transistor 1414, so that the potential (FD1) of the signal charge storage portion 1410 is lowered by discharge. When the potential (TRF1) of the first transfer switch line 1451 becomes a low level, the first transfer transistor 1414 is turned off, so that the potential (FD1) of the signal charge storage portion 1410 is held because a current path is interrupted. This potential is output to a vertical output line 1470 through the first amplifier transistor 1408.

In driving of a second line, first, when the potential (RST1) of the first reset signal line 1461 becomes a high level, a forward bias is applied to a second photodiode 1422, and the potential of a cathode of the second photodiode 1422 is lower than the high-level potential of the first reset signal line 1461 by the forward voltage ($V_f$) of the photodiode. Then, when the potential (TRF2) of a second transfer switch line 1452 becomes a high level, a second transfer transistor 1424 is turned on, so that the potential (FD1) of the signal charge storage portion 1410 is the same as the potential of the cathode of the second photodiode 1422. Next, when the potential (RST1) of the first reset signal line 1461 becomes a low level, the potential of an anode of the photodiode becomes a low level. At this time, a reverse bias is applied to the second photodiode 1422. Here, current corresponding to light which enters the second photodiode 1422 flows to the second photodiode 1422 and the second transfer transistor 1424, so that the potential (FD1) of the signal charge storage portion 1410 is lowered by discharge. When the potential (TRF2) of the second transfer switch line 1452 becomes a low level, the second transfer transistor 1424 is turned off, so that the potential (FD1) of the signal charge storage portion 1410 is held because a current path is interrupted. This potential is output to the vertical output line 1470 through the first amplifier transistor 1408.

In driving of a third line, first, when the potential (RST1) of the first reset signal line 1461 becomes a high level, a forward bias is applied to a third photodiode 1432, and the potential of a cathode of the third photodiode 1432 is lower than the high-level potential of the first reset signal line 1461 by the forward voltage ($V_f$) of the photodiode. Then, when the potential (TRF3) of a third transfer switch line 1453 becomes a high level, a third transfer transistor 1434 is turned on, so that the potential (FD1) of the signal charge storage portion 1410 is the same as the potential of the cathode of the third photodiode 1432. Next, when the potential (RST1) of the first reset signal line 1461 becomes a low level, the potential of an anode of the photodiode becomes a low level. At this time, a reverse bias is applied to the first photodiode 1412. Here, current corresponding to light which enters the third photodiode 1432 flows to the third photodiode 1432 and the third transfer transistor 1434, so that the potential (FD1) of the signal charge storage portion 1410 is lowered by discharge. When the potential (TRF3) of the third transfer switch line 1453 becomes a low level, the third transfer transistor 1434 is turned off, so that the potential (FD1) of the signal charge storage portion 1410 is held because a current path is interrupted. This potential is output to the vertical output line 1470 through the first amplifier transistor 1408.

In driving of a fourth line, first, when the potential (RST1) of the first reset signal line 1461 becomes a high level, a forward bias is applied to a fourth photodiode 1442, and the potential of a cathode of the fourth photodiode 1442 is lower than the high-level potential of the first reset signal line 1461 by the forward voltage ($V_f$) of the photodiode. Then, when the potential (TRF4) of a fourth transfer switch line 1454 becomes a high level, a fourth transfer transistor 1444 is turned on, so that the potential (FD1) of the signal charge storage portion 1410 is the same as the potential of the cathode of the fourth photodiode 1442. Next, when the potential (RST1) of the first reset signal line 1461 becomes a low level, the potential of an anode of the photodiode becomes a low level. At this time, a reverse bias is applied to the fourth photodiode 1442. Here, current corresponding to light which enters the fourth photodiode 1442 flows to the fourth photodiode 1442 and the fourth transfer transistor 1444, so that the potential (FD1) of the signal charge storage portion 1410 is lowered by discharge. When the potential (TRF4) of the fourth transfer switch line 1454 becomes a low level, the second transfer transistor 1444 is turned off, so that the potential (FD1) of the signal charge storage portion 1410 is held because a current path is interrupted. This potential is output to the vertical output line 1470 through the first amplifier transistor 1408. In driving of fifth to eighth lines, the potential of a second reset signal line becomes a high level, and similar sequential driving is performed.

Figure 20:
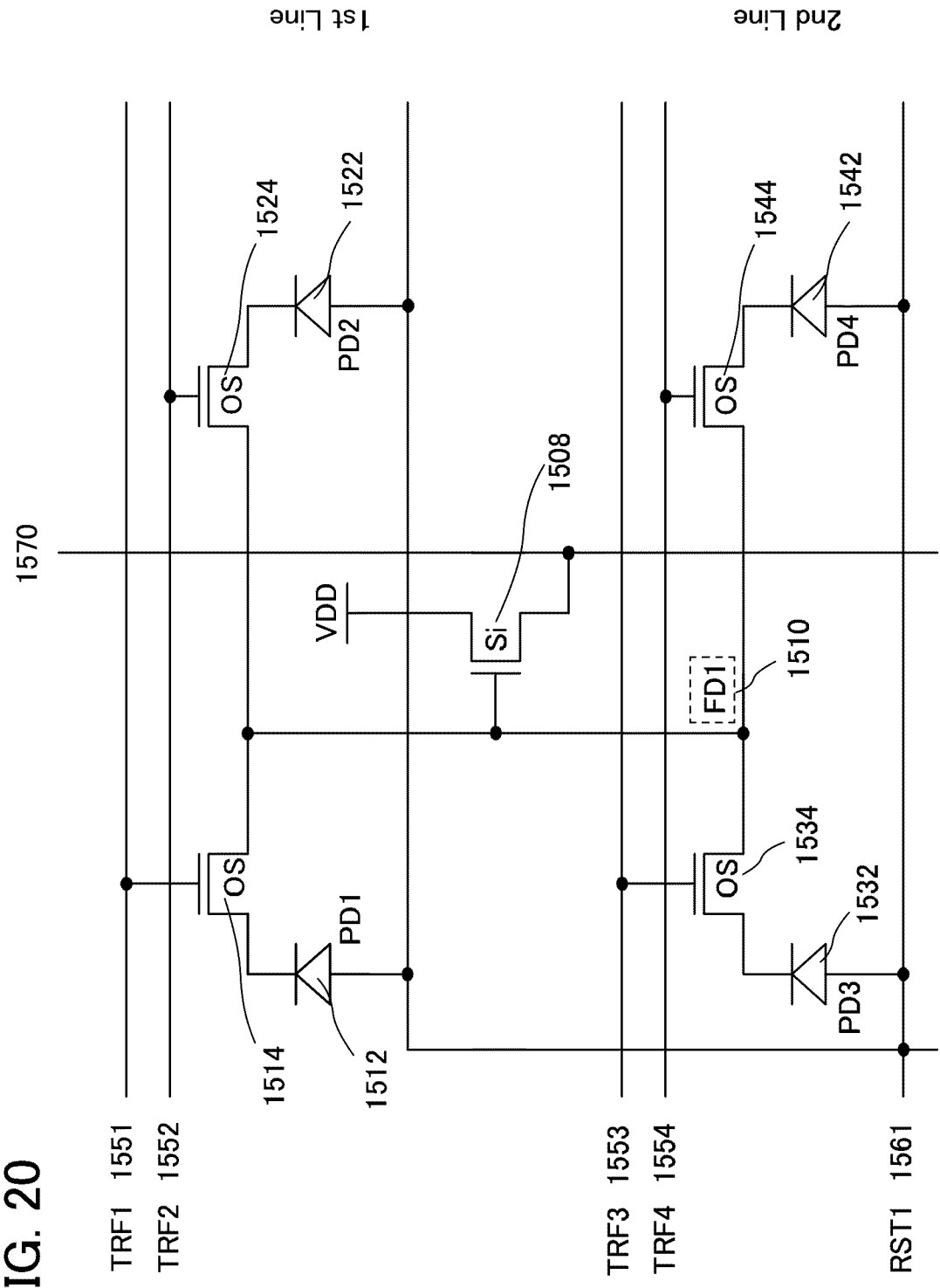
FIG. 20 illustrates structures of pixels of solid-state image sensors.

FIG. 20 illustrates structures of four pixels arranged longitudinally and laterally that are different from the structures in FIG. 18. In the structures illustrated in FIG. 20, a reset signal line and an amplifier transistor are used in common among two pixels arranged longitudinally and two pixels arranged laterally. As in the structures of four pixels arranged longitudinally, when the number of transistors and the number of wirings are reduced, miniaturization due to the decrease in the pixel area and reduction in noise due to the increase in the light reception area of a photodiode can be realized. Drains of transfer transistors in the four pixels arranged longitudinally and laterally are electrically connected to each other, so that a signal charge storage portion 1510 is formed. A gate of an amplifier transistor 1508 is connected to the signal charge storage portion 1510.

Figure 21:
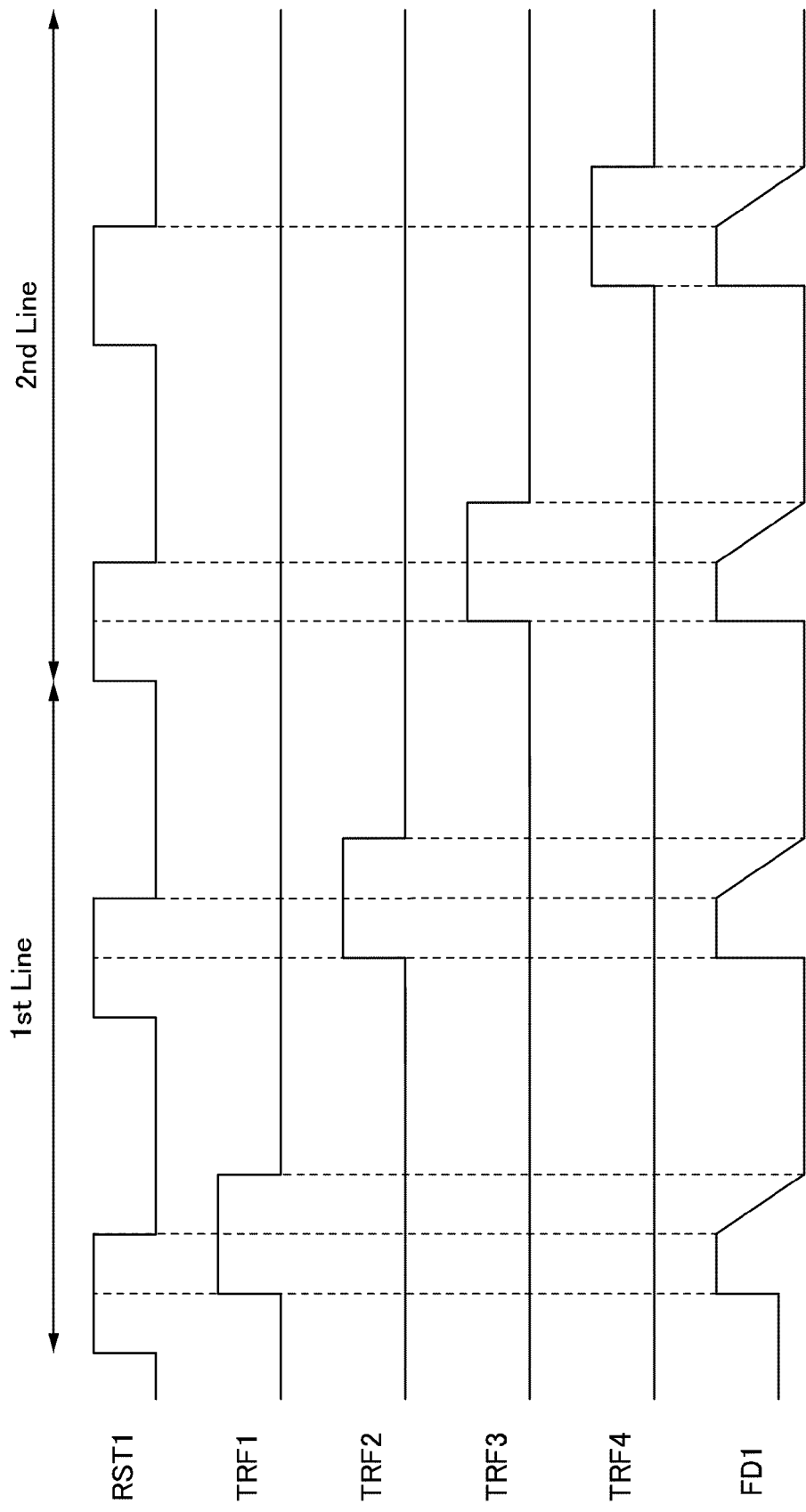
FIG. 21 illustrates operation of the pixels of the solid-state image sensors.

The operation in the structures of four pixels arranged longitudinally and laterally is described with reference to a timing chart in FIG. 21. In driving of a first line, first, when the potential (RST1) of a first reset signal line 1561 becomes a high level, a forward bias is applied to a first photodiode 1512, and the potential of a cathode of the first photodiode 1512 is lower than the high-level potential of the first reset signal line 1561 by the forward voltage ($V_f$) of the photodiode. Then, when the potential (TRF1) of a first transfer switch line 1551 becomes a high level, a first transfer transistor 1514 is turned on, so that the potential (FD1) of the signal charge storage portion 1510 is the same as the potential of the cathode of the first photodiode 1512.

Next, when the potential (RST1) of the first reset signal line 1561 becomes a low level, the potential of an anode of the photodiode becomes a low level. At this time, a reverse bias is applied to the first photodiode 1512. Here, current corresponding to light which enters the first photodiode 1512 flows to the first photodiode 1512 and the first transfer transistor 1514, so that the potential (FD1) of the signal charge storage portion 1510 is lowered by discharge. When the potential (TRF1) of the first transfer switch line 1551 becomes a low level, the first transfer transistor 1514 is turned off, so that the potential (FD1) of the signal charge storage portion 1510 is held because a current path is interrupted. This potential is output to a vertical output line 1570 through a first amplifier transistor 1508.

Then, when the potential (RST1) of the first reset signal line 1561 becomes a high level again, a forward bias is applied to a second photodiode 1522, and the potential of a cathode of the second photodiode 1522 is lower than the high-level potential of the first reset signal line 1561 by the forward voltage ($V_f$) of the photodiode. Then, when the potential (TRF2) of a second transfer switch line 1552 becomes a high level, a second transfer transistor 1524 is turned on, so that the potential (FD1) of the signal charge storage portion 1510 is the same as the potential of the cathode of the second photodiode 1522.

Next, when the potential (RST1) of the first reset signal line 1561 becomes a low level, the potential of an anode of the photodiode becomes a low level. At this time, a reverse bias is applied to the second photodiode 1522. Here, current corresponding to light which enters the second photodiode 1522 flows to the second photodiode 1522 and the second transfer transistor 1524, so that the potential (FD1) of the signal charge storage portion 1510 is lowered by discharge. When the potential (TRF2) of the second transfer switch line 1552 becomes a low level, the second transfer transistor 1524 is turned off, so that the potential (FD1) of the signal charge storage portion 1510 is held because a current path is interrupted. This potential is output to the vertical output line 1570 through the first amplifier transistor 1508. Outputs of the pixels in the first line are sequentially output to the vertical output line 1570 through the two operations.

In driving of a second line, first, when the potential (RST1) of the first reset signal line 1561 becomes a high level, a forward bias is applied to a third photodiode 1532, and the potential of a cathode of the third photodiode 1532 is lower than the high-level potential of the first reset signal line 1561 by the forward voltage ($V_f$) of the photodiode. Then, when the potential (TRF3) of a third transfer switch line 1553 becomes a high level, a third transfer transistor 1534 is turned on, so that the potential (FD1) of the signal charge storage portion 1510 is the same as the potential of the cathode of the third photodiode 1532.

Next, when the potential (RST1) of the first reset signal line 1561 becomes a low level, the potential of an anode of the photodiode becomes a low level. At this time, a reverse bias is applied to the third photodiode 1532. Here, current corresponding to light which enters the third photodiode 1532 flows to the third photodiode 1532 and the third transfer transistor 1534, so that the potential (FD1) of the signal charge storage portion 1510 is lowered by discharge. When the potential (TRF3) of the third transfer switch line 1553 becomes a low level, the third transfer transistor 1534 is turned off, so that the potential (FD1) of the signal charge storage portion 1510 is held because a current path is interrupted. This potential is output to the vertical output line 1570 through the first amplifier transistor 1508.

Then, when the potential (RST1) of the first reset signal line 1561 becomes a high level again, a forward bias is applied to a fourth photodiode 1542, and the potential of a cathode of the fourth photodiode 1542 is lower than the high-level potential of the first reset signal line 1561 by the forward voltage ($V_f$) of the photodiode. Then, when the potential (TRF4) of a fourth transfer switch line 1554 becomes a high level, a fourth transfer transistor 1544 is turned on, so that the potential (FD1) of the signal charge storage portion 1510 is the same as the potential of the cathode of the fourth photodiode 1542.

Next, when the potential (RST1) of the first reset signal line 1561 becomes a low level, the potential of an anode of the photodiode becomes a low level. At this time, a reverse bias is applied to the fourth photodiode 1542. Here, current corresponding to light which enters the fourth photodiode 1542 flows to the fourth photodiode 1542 and the fourth transfer transistor 1544, so that the potential (FD1) of the signal charge storage portion 1510 is lowered by discharge. When the potential (TRF4) of the fourth transfer switch line 1554 becomes a low level, the fourth transfer transistor 1544 is turned off, so that the potential (FD1) of the signal charge storage portion 1510 is held because a current path is interrupted. This potential is output to the vertical output line 1570 through the first amplifier transistor 1508. Outputs of the pixels in the second line are sequentially output to the vertical output line 1570 through the two operations. Next, the potential of the second reset signal line becomes a high level, and sequential driving is performed similarly.

Figure 22:
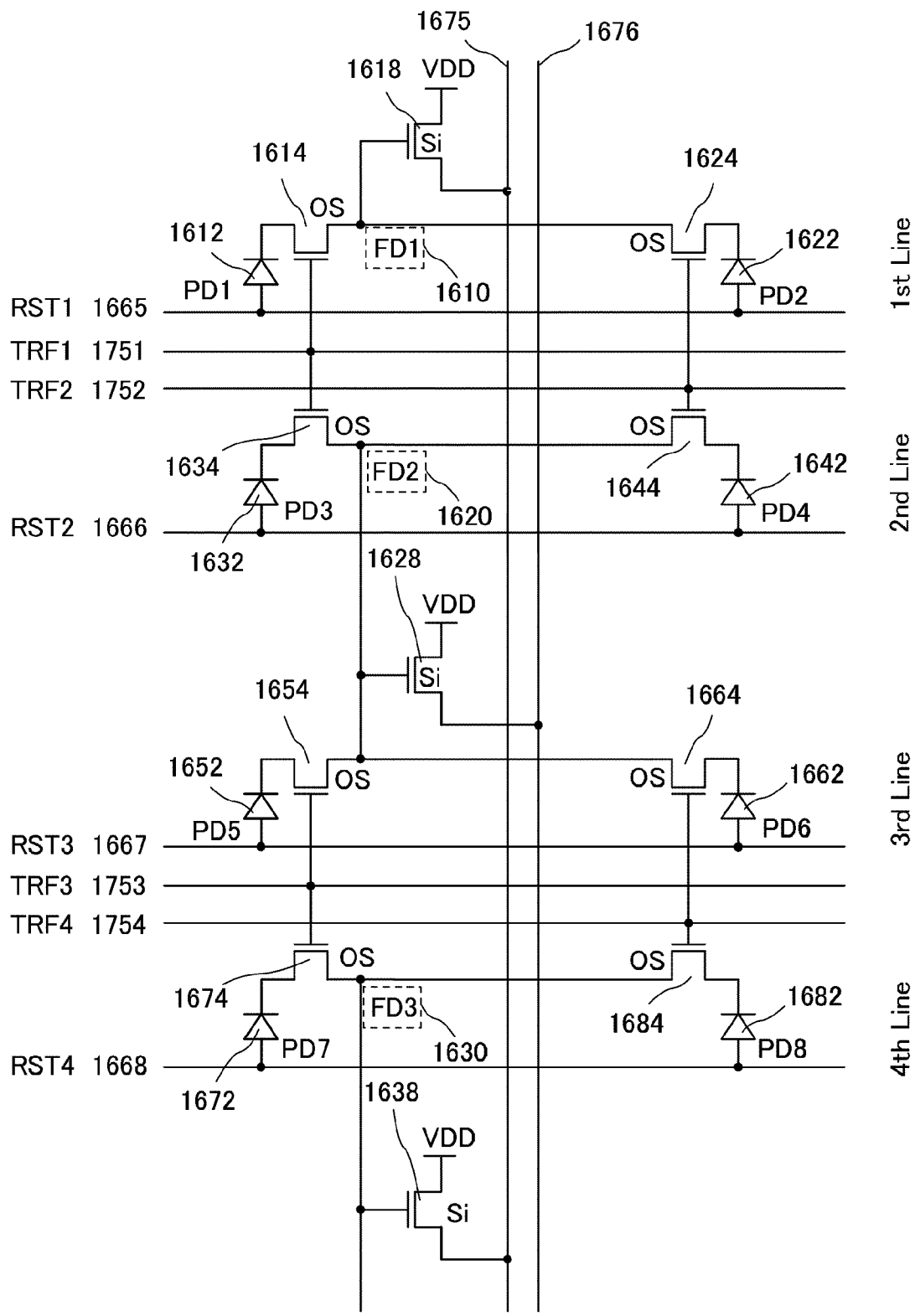
FIG. 22 illustrates structures of pixels of solid-state image sensors.

FIG. 22 illustrates structures where a transfer switch line is used in common. In the structures illustrated in FIG. 22, a reset signal line, a transfer switch line, and an amplifier transistor are used in common among two pixels arranged longitudinally and two pixels arranged laterally. The transfer switch used in common is added to the above structures where the reset signal line and the amplifier transistor are used in common. When the number of transistors and the number of wirings are reduced, miniaturization due to the decrease in the pixel area and reduction in noise due to the increase in the light reception area of a photodiode can be realized. Drains of transfer transistors in the four pixels arranged longitudinally and laterally are electrically connected to each other, so that a signal charge storage portion is formed. A gate of an amplifier transistor is connected to the signal charge storage portion. In the structures, the transfer switch line is used in common between two transfer transistors positioned longitudinally, so that transistors which operate in a lateral direction and a longitudinal direction concurrently are provided.

Figure 23:
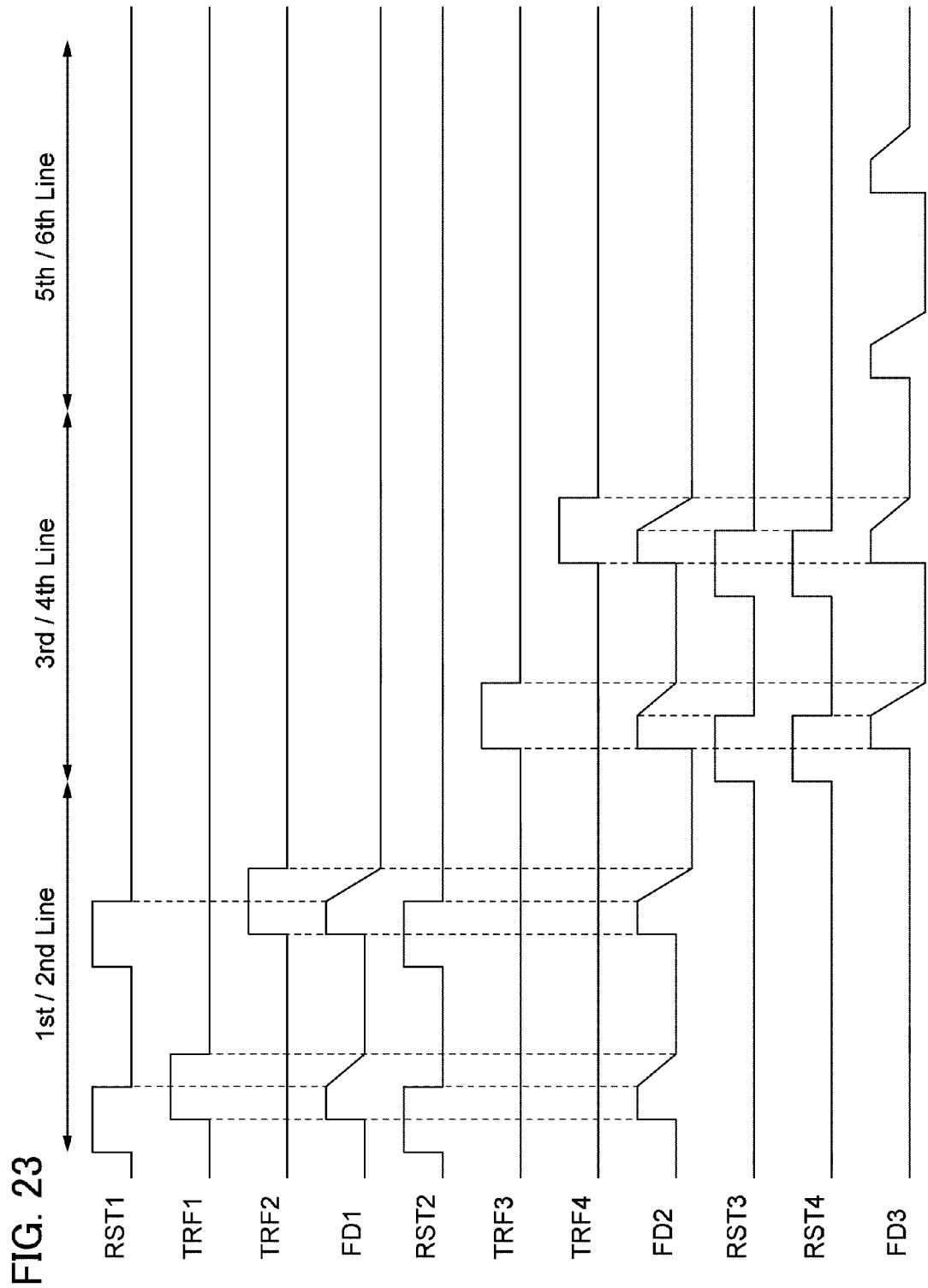
FIG. 23 illustrates operation of the pixels of the solid-state image sensors.

The operation of the structures where the transfer switch line is used in common is described with reference to a timing chart in FIG. 23. In driving of a first line and a second line, first, when the potential (RST1) of a first reset signal line 1665 and the potential (RST2) of a second reset signal line 1666 become a high level, forward biases are applied to a first photodiode 1612 and a third photodiode 1632, so that the potential of a cathode of the first photodiode 1612 and the potential of a cathode of the third photodiode 1632 are lower than the high-level potential of the first reset signal line 1665 and the high-level potential of the second reset signal line 1666, respectively, by the forward voltage ($V_f$) of the photodiode.

Next, when the potential (TRF1) of a first transfer switch line 1751 becomes a high level, a first transfer transistor 1614 is turned on, so that the potential (FD1) of a first signal charge storage portion 1610 is the same as the potential of the cathode of the first photodiode 1612 and the potential (FD2) of a second signal charge storage portion 1620 is the same as the potential of the cathode of the third photodiode 1632. Then, when the potential (RST1) of the first reset signal line 1665 and the potential (RST2) of the second reset signal line 1666 become a low level, the potentials of anodes of the photodiodes become a low level. At this time, reverse biases are applied to the first photodiode 1612 and the third photodiode 1632. Here, current corresponding to light which enters the first photodiode 1612 flows to the first photodiode 1612 and the first transfer transistor 1614 and current corresponding to light which enters the third photodiode 1632 flows to the third photodiode 1632 and the third transfer transistor 1634, so that the potential (FD1) of the first signal charge storage portion 1610 and the potential (FD2) of the second signal charge storage portion 1620 are lowered by discharge. When the potential (TRF1) of the first transfer switch line 1751 becomes a low level, the first transfer transistor 1614 and the third transfer transistor 1634 are turned off, so that the potential (FD1) of the first signal charge storage portion 1610 and the potential (FD2) of the second signal charge storage portion 1620 are held because current paths are interrupted. These potentials are output to a first vertical output line 1675 through a first amplifier transistor 1618 and a second vertical output line 1676 through a second amplifier transistor 1628.

Next, when the potential (RST1) of the first reset signal line 1665 and the potential (RST2) of the second reset signal line 1666 become a high level again, forward biases are applied to a second photodiode 1622 and a fourth photodiode 1642, so that the potential of a cathode of the second photodiode 1622 and the potential of a cathode of the fourth photodiode 1642 are lower than the high-level potential of the first reset signal line 1665 and the high-level potential of the second reset signal line 1666, respectively, by the forward voltage ($V_f$) of the photodiode.

Next, when the potential (TRF2) of a second transfer switch line 1752 becomes a high level, a second transfer transistor 1624 and a fourth transfer transistor 1644 are turned on, so that the potential (FD1) of the first signal charge storage portion 1610 is the same as the potential of the cathode of the second photodiode 1622 and the potential (FD2) of the second signal charge storage portion 1620 is the same as the potential of the cathode of the fourth photodiode 1642. Then, when the potential (RST1) of the first reset signal line 1665 and the potential (RST2) of the second reset signal line 1666 become a low level, the potentials of anodes of the photodiodes become a low level. At this time, reverse biases are applied to the second photodiode 1622 and the fourth photodiode 1642. Here, current corresponding to light which enters the second photodiode 1622 flows to the second photodiode 1622 and the second transfer transistor 1624 and current corresponding to light which enters the fourth photodiode 1642 flows to the fourth photodiode 1642 and the fourth transfer transistor 1644, so that the potential (FD1) of the first signal charge storage portion 1610 and the potential (FD2) of the second signal charge storage portion 1620 are lowered by discharge. When the potential (TRF2) of the second transfer switch line 1572 becomes a low level, the second transfer transistor 1624 and the fourth transfer transistor 1644 are turned off, so that the potential (FD1) of the first signal charge storage portion 1610 and the potential (FD2) of the second signal charge storage portion 1620 are held because current paths are interrupted. These potentials are output to the first vertical output line 1675 through the first amplifier transistor 1618 and the second vertical output line 1676 through the second amplifier transistor 1628. Outputs of the pixels in the first line and the second line are sequentially output to the first vertical output line 1675 and the second vertical output line 1676 through the two operations.

The operation in driving of a third line and a fourth line is described. First, when the potential (RST3) of a third reset signal line 1667 and the potential (RST4) of a fourth reset signal line 1668 become a high level, forward biases are applied to a fifth photodiode 1652 and a seventh photodiode 1672, so that the potential of a cathode of the fifth photodiode 1652 and the potential of a cathode of the seventh photodiode 1672 are lower than the high-level potential of the third reset signal line 1667 and the high-level potential of the fourth reset signal line 1668, respectively, by the forward voltage ($V_f$) of the photodiode.

Next, when the potential (TRF3) of a third transfer switch line 1753 becomes a high level, a fifth transfer transistor 1654 and a seventh transfer transistor 1674 are turned on, so that the potential (FD2) of the second signal charge storage portion

1620 is the same as the potential of the cathode of the fifth photodiode 1652 and the potential (FD3) of a third signal charge storage portion 1630 is the same as the potential of the cathode of the seventh photodiode 1672. Then, when the potential (RST3) of the third reset signal line 1667 and the potential (RST4) of the fourth reset signal line 1668 become a low level, the potentials of anodes of the photodiodes become a low level. At this time, reverse biases are applied to the fifth photodiode 1652 and the seventh photodiode 1672. Here, current corresponding to light which enters the fifth photodiode 1652 flows to the fifth photodiode 1652 and the fifth transfer transistor 1654 and current corresponding to light which enters the seventh photodiode 1672 flows to the seventh photodiode 1672 and the seventh transfer transistor 1674, so that the potential (FD2) of the second signal charge storage portion 1620 and the potential (FD3) of the third signal charge storage portion 1630 are lowered by discharge. When the potential (TRF3) of the third transfer switch line 1753 becomes a low level, the fifth transfer transistor 1654 and the seventh transfer transistor 1674 are turned off, so that the potential (FD2) of the second signal charge storage portion 1620 and the potential (FD3) of the third signal charge storage portion 1630 are held because current paths are interrupted. This potential is output to the second vertical output line 1676 through the second amplifier transistor and the first vertical output line 1675 through a third amplifier transistor.

Next, when the potential (RST3) of the third reset signal line 1667 and the potential (RST4) of the fourth reset signal line 1668 become a high level again, forward biases are applied to a sixth photodiode 1662 and an eighth photodiode 1682, so that the potential of a cathode of the sixth photodiode 1662 and the potential of a cathode of the eighth photodiode 1682 are lower than the high-level potential of the third reset signal line 1667 and the high-level potential of the fourth reset signal line 1668, respectively, by the forward voltage ($V_f$) of the photodiode.

Next, when the potential (TRF4) of a fourth transfer switch line 1754 becomes a high level, a sixth transfer transistor 1664 and an eighth transfer transistor 1684 are turned on, so that the potential (FD2) of the second signal charge storage portion 1620 is the same as the potential of the cathode of the sixth photodiode 1662 and the potential (FD3) of the third signal charge storage portion 1630 is the same as the potential of the cathode of the eighth photodiode 1682. Then, when the potential (RST3) of the third reset signal line 1667 and the potential (RST4) of the fourth reset signal line 1668 become a low level, the potentials of anodes of the photodiodes become a low level. At this time, reverse biases are applied to the sixth photodiode 1662 and the eighth photodiode 1682. Here, current corresponding to light which enters the sixth photodiode 1662 flows to the sixth photodiode 1662 and the sixth transfer transistor 1664 and current corresponding to light which enters the eighth photodiode 1682 flows to the eighth photodiode 1682 and the eighth transfer transistor 1684, so that the potential (FD2) of the second signal charge storage portion 1620 and the potential (FD3) of the third signal charge storage portion 1630 are lowered by discharge. When the potential (TRF4) of the fourth transfer switch line 1754 becomes a low level, the sixth transfer transistor 1664 and the eighth transfer transistor 1684 are turned off, so that the potential (FD2) of the second signal charge storage portion 1620 and the potential (FD3) of the third signal charge storage portion 1630 are held because current paths are interrupted. This potential is output to the second vertical output line 1676 through the second amplifier transistor and the first vertical output line 1675 through the third amplifier transistor. Outputs of the pixels in the third line and the fourth line are sequentially output to the second vertical output line 1676 and the first vertical output line 1675 through the two operations. The following operations are sequentially performed in this manner.

Figure 24:
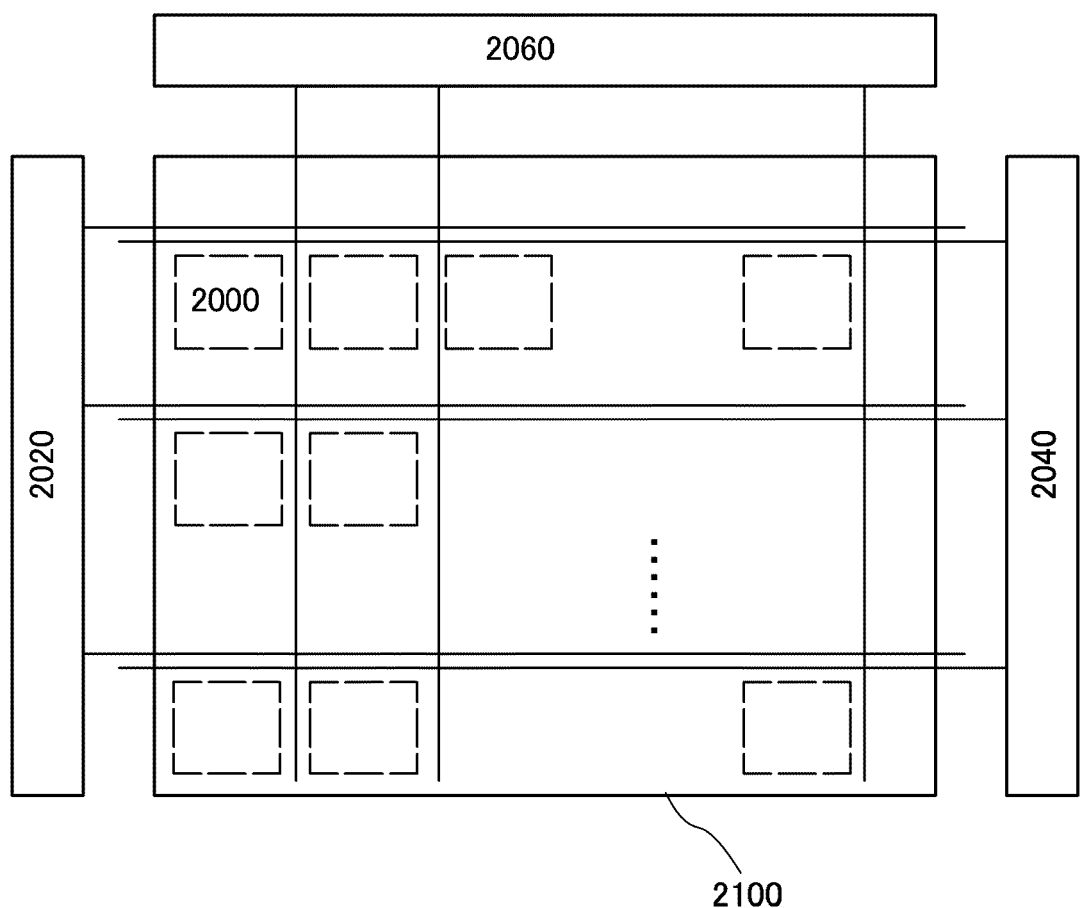
FIG. 24 illustrates structures of pixels of solid-state image sensors.
Figure 25:
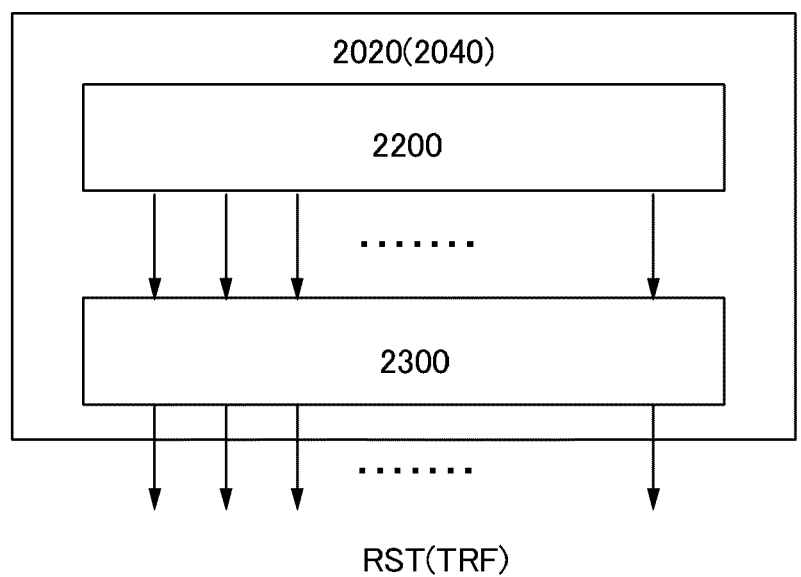
FIG. 25 illustrates structures of a reset terminal driver circuit and a transfer terminal driver circuit.

FIG. 24 illustrates the entire CMOS image sensor. A reset terminal driver circuit 2020 and a transfer terminal driver circuit 2040 are provided on opposite sides of a pixel matrix 2100 including pixel portions 2000. The driver circuits are provided on the opposite sides of the pixel matrix 2100 in FIG. 24; however, the driver circuits may be provided only one side. In addition, a vertical output line driver circuit 2060 is provided in a direction vertical to wirings for outputting signals from the driver circuits. The reset terminal driver circuit 2020 and the transfer terminal driver circuit 2040 are driver circuits for outputting signals having binary values (a low potential and a high potential); thus, driving can be performed with a combination of a shift register 2200 and a buffer circuit 2300, as illustrated in FIG. 25. These driver circuits can be formed using bulk transistors or thin film transistors. In particular, these driver circuits are preferably formed using bulk transistors including silicon semiconductors that can be used for the formation of complementary transistors.

Figure 26:
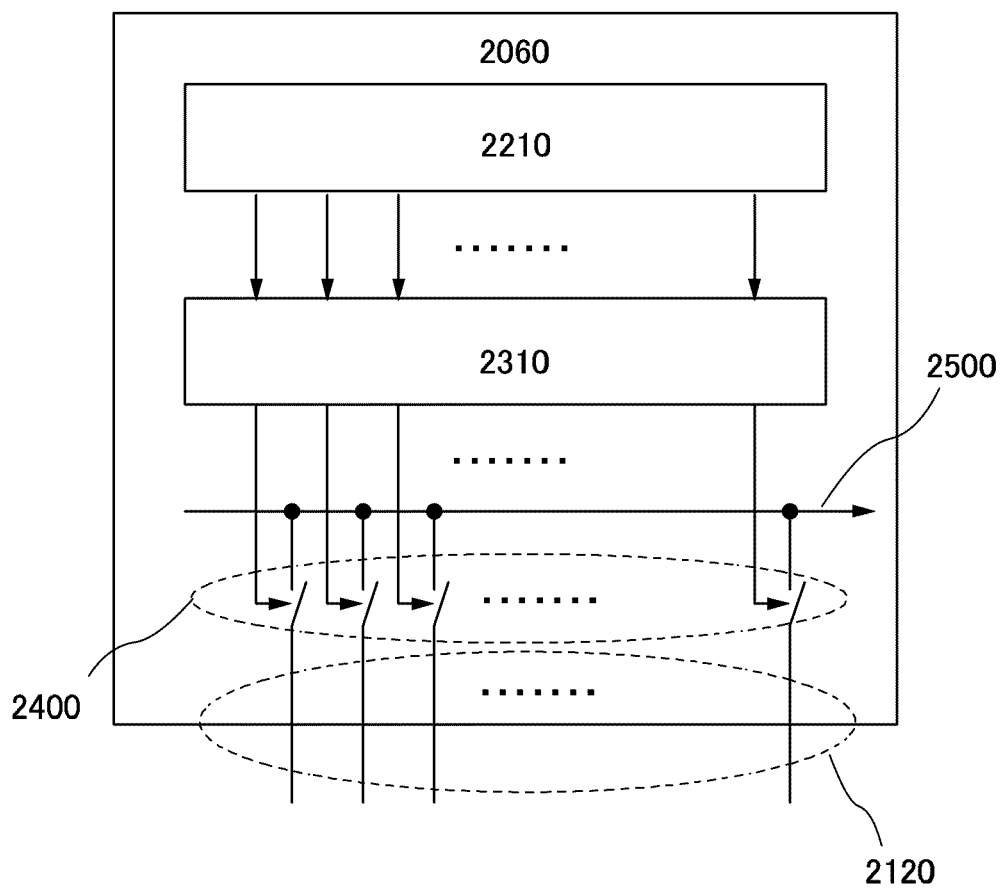
FIG. 26 illustrates a structure of a vertical output line driver circuit.

The vertical output line driver circuit 2060 can include a shift register 2210, a buffer circuit 2310, and analog switches 2400, as illustrated in FIG. 26. Vertical output lines 2120 are selected with the analog switches 2400, and an image signal is output to an image output line 2500. The analog switches 2400 are sequentially selected by the shift register 2210 and the buffer circuit 2310. The vertical output line driver circuit 2060 can be formed using a bulk transistor or a thin film transistor. In particular, the vertical output line driver circuit 2060 is preferably formed using a bulk transistor including a silicon semiconductor that can be used for the formation of a complementary transistor.

Figure 27:
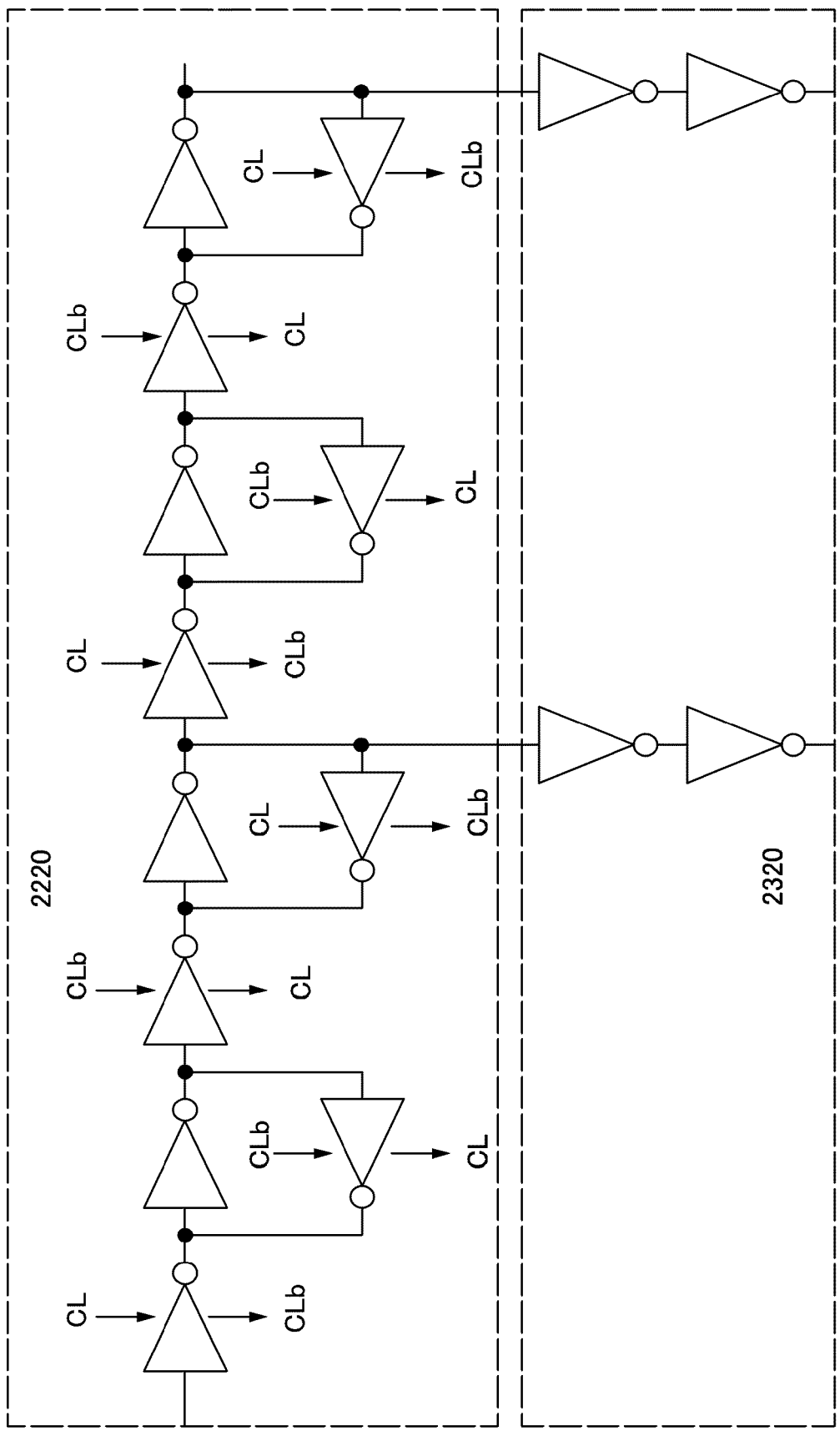
FIG. 27 illustrates examples of a shift register and a buffer circuit.

FIG. 27 illustrates examples of the shift register and the buffer circuit. Specifically, FIG. 27 illustrates examples of a shift register 2220 including a clocked inverter and a buffer circuit 2320 including an inverter. The shift register and the buffer circuit are not limited to these circuits. Further, the structures of the reset terminal driver circuit 2020, the transfer terminal driver circuit 2040, and the vertical output line driver circuit 2060 are not limited to the above structures.

The solid-state image sensor in any of the above embodiments can be used in a variety of electronic devices (including an amusement machine). For example, the solid-state image sensor can be used in an electronic device which has a unit for acquiring image data, such as a digital camera, digital video camera, a mobile phone, a portable game machine, or a portable information terminal.

This embodiment mode can be combined with any of the other embodiments as appropriate.

This application is based on Japanese Patent Application serial no. 2009-255253 filed with Japan Patent Office on Nov. 6, 2009, the entire contents of which are hereby incorporated by reference.

REFERENCE NUMERALS

100: single crystal silicon substrate, 101: transfer transistor, 102: oxide semiconductor layer, 104: source electrode, 106: drain electrode, 108: gate electrode, 110: photoelectric conversion element, 114: p-type region, 116: signal charge storage portion, 118: gate insulating layer, 131: amplifier transistor, 136: gate insulating layer, 138: gate electrode, 140: insulating film, 142: protective insulating film, 152: wiring layer, 154: wiring, 132*a*: n-type region, 138*a*: conductive layer, 138b: conductive layer, 201: transistor, 204: source electrode, 210: photoelectric conversion element, 301: transistor, 304: source electrode, 305: buffer layer, 306: drain electrode, 310: photoelectric conversion element, 112: n-type region, 450: nitrogen atmosphere, 501: transfer transistor, 510: photoelectric conversion element, 516: signal charge storage portion, 531: amplifier transistor, 540: capacitor electrode, 541: insulating film, 600: lens, 602: color filter, 604: wiring layer, 606: interlayer insulating film, 608: photoelectric conversion element, 610: lens, 612: color filter, 618: photoelectric conversion element, 1002: photodiode, 1004: transfer transistor, 1006: reset transistor, 1008: amplifier transistor, 1010: signal charge storage portion, 1040: reset signal line, 1050: transfer switch line, 1120: vertical output line, 1210: signal charge storage portion, 1212: photodiode, 1214: transfer transistor, 1218: amplifier transistor, 1220: vertical output line, 1240: reset signal line, 1250: transfer switch line, 1408: amplifier transistor, 1410: signal charge storage portion, 1412: photodiode, 1414: transfer transistor, 1422: photodiode, 1424: transfer transistor, 1432: photodiode, 1434: transfer transistor, 1442: photodiode, 1444: transfer transistor, 1451: transfer switch line, 1452: transfer switch line, 1453: transfer switch line, 1454: transfer switch line, 1461: reset signal line, 1470: vertical output line, 1508: amplifier transistor, 1510: signal charge storage portion, 1512: photodiode, 1514: transfer transistor, 1522: photodiode, 1524: transfer transistor, 1532: photodiode, 1534: transfer transistor, 1542: photodiode, 1544: transfer transistor, 1551: transfer switch line, 1552: transfer switch line, 1553: transfer switch line, 1554: transfer switch line, 1561: reset signal line, 1570: vertical output line, 1572: transfer switch line, 1610: signal charge storage portion, 1612: photodiode, 1614: transfer transistor, 1618: amplifier transistor, 1620: signal charge storage portion, 1622: photodiode, 1624: transfer transistor, 1628: amplifier transistor, 1630: signal charge storage portion, 1632: photodiode, 1634: transfer transistor, 1642: photodiode, 1644: transfer transistor, 1652: photodiode, 1654: transfer transistor, 1662: photodiode, 1664: transfer transistor, 1665: reset signal line, 1666: reset signal line, 1667: reset signal line, 1668: reset signal line, 1672: photodiode, 1674: reset transistor, 1675: vertical output line, 1676: vertical output line, 1682: photodiode, 1684: transfer transistor, 1751: transfer switch line, 1753: transfer switch line, 1754: transfer switch line, 2000: pixel portion, 2020: reset terminal driver circuit, 2040: transfer terminal driver circuit, 2060: vertical output line driver circuit, 2100: pixel matrix, 2120: vertical output line, 2200: shift register, 2210: shift register, 2220: shift register, 2300: buffer circuit, 2310: buffer circuit, 2320: buffer circuit, 2400: analog switch, and 2500: image output line.

The invention claimed is:

1. A semiconductor device comprising:
 a pixel portion over a substrate comprising a silicon semiconductor, the pixel portion comprising:
  a photoelectric conversion element portion buried in the substrate;
  a transfer transistor having a source electrode electrically connected to the photoelectric conversion element portion;
  a signal charge storage portion electrically connected to the transfer transistor;
  an amplifier transistor, wherein a channel formation region of the amplifier transistor is formed in the substrate and a gate of the amplifier transistor is electrically connected to the signal charge storage portion;
  a first insulating layer over the substrate and the gate of the amplifier transistor;
  a wiring layer over the first insulating layer, the wiring layer electrically connected to a source or a drain of the amplifier transistor; and
  a second insulating layer over the wiring layer, wherein a channel formation region of the transfer transistor is formed over the second insulating layer,
 wherein the channel formation region of the transfer transistor comprises an oxide semiconductor, and
 wherein the amplifier transistor and the transfer transistor overlap at least partly.

2. The semiconductor device according to claim 1, wherein off-state current of the transfer transistor is $1 \times 10^{-13}$ A or less.

3. The semiconductor device according to claim 1, wherein a carrier concentration in the oxide semiconductor is lower than $1 \times 10^{14}/cm^3$.

4. The semiconductor device according to claim 1, wherein the signal charge storage portion includes a capacitor including an electrode over the second insulating layer.

5. An electronic device comprising the semiconductor device according to claim 1.

6. The semiconductor device according to claim 1, wherein a concentration of hydrogen in the oxide semiconductor is $5 \times 10^{19}$ atoms/cm$^3$ or lower.

7. The semiconductor device according to claim 1, wherein a lens and a color filter are provided over the pixel portion.

8. The semiconductor device according to claim 1, wherein a lens and a color filter are provided on a surface of the substrate which is opposite to a surface where the pixel portion is provided.

9. The semiconductor device according to claim 1, further comprising a reset signal line directly connected to the photoelectric conversion element portion.

10. A semiconductor device comprising:
 a pixel portion over a substrate comprising a silicon semiconductor, the pixel portion comprising:
  a photoelectric conversion element portion buried in the substrate;
  a transfer transistor having a source electrode electrically connected to the photoelectric conversion element portion;
  a signal charge storage portion electrically connected to the transfer transistor;
  an amplifier transistor, wherein a channel formation region of the amplifier transistor is formed in the substrate and a gate of the amplifier transistor is electrically connected to the signal charge storage portion;
  a first insulating layer over the substrate and the gate of the amplifier transistor;
  a wiring layer over the first insulating layer, the wiring layer electrically connected to a source or a drain of the amplifier transistor; and
  a second insulating layer over the wiring layer, wherein a channel formation region of the transfer transistor is formed over the second insulating layer,
 a peripheral circuit portion including a transistor having a channel formation region in the substrate, the peripheral circuit portion electrically connected to the pixel portion,
 wherein the channel formation region of the transfer transistor comprises an oxide semiconductor, and
 wherein the amplifier transistor and the transfer transistor overlap at least partly.

11. The semiconductor device according to claim 10, wherein off-state current of the transfer transistor is $1\times10^{-13}$ A or less.

12. The semiconductor device according to claim 10, wherein a carrier concentration in the oxide semiconductor is lower than $1\times10^{14}/cm^3$.

13. The semiconductor device according to claim 10, wherein the signal charge storage portion includes a capacitor including an electrode over the second insulating layer.

14. An electronic device comprising the semiconductor device according to claim 10.

15. The semiconductor device according to claim 10, wherein a concentration of hydrogen in the oxide semiconductor is $5\times10^{19}$ atoms/cm$^3$ or lower.

16. The semiconductor device according to claim 10, wherein a lens and a color filter are provided over the pixel portion.

17. The semiconductor device according to claim 10, wherein a lens and a color filter are provided on a surface of the substrate which is opposite to a surface where the pixel portion and the peripheral circuit portion are provided.

18. The semiconductor device according to claim 10, further comprising a reset signal line directly connected to the photoelectric conversion element portion.

19. A semiconductor device comprising:
   a pixel portion comprising:
      a photoelectric conversion element portion;
      a transfer transistor having a source electrode electrically connected to the photoelectric conversion element portion;
      a signal charge storage portion electrically connected to the transfer transistor;
      an amplifier transistor, wherein a channel formation region of the amplifier transistor comprises single crystal silicon and a gate of the amplifier transistor is electrically connected to the signal charge storage portion;
      a first insulating layer over the gate of the amplifier transistor;
      a wiring layer over the first insulating layer, the wiring layer electrically connected to a source or a drain of the amplifier transistor; and
      a second insulating layer over the wiring layer, wherein a channel formation region of the transfer transistor is formed over the second insulating layer,
   wherein the channel formation region of the transfer transistor comprises an oxide semiconductor, and
   wherein the amplifier transistor and the transfer transistor overlap at least partly.

20. The semiconductor device according to claim 19, wherein off-state current of the transfer transistor is $1\times10^{-13}$ A or less.

21. The semiconductor device according to claim 19, wherein a carrier concentration in the oxide semiconductor is lower than $1\times10^{14}/cm^3$.

22. The semiconductor device according to claim 19, wherein the signal charge storage portion includes a capacitor including an electrode over the second insulating layer.

23. An electronic device comprising the semiconductor device according to claim 19.

24. The semiconductor device according to claim 19, wherein a concentration of hydrogen in the oxide semiconductor is $5\times10^{19}$ atoms/cm$^3$ or lower.

25. The semiconductor device according to claim 19, wherein a lens and a color filter are provided over the pixel portion.

26. The semiconductor device according to claim 19, further comprising a reset signal line directly connected to the photoelectric conversion element portion.

27. The semiconductor device according to claim 19, wherein the photoelectric conversion element portion comprises silicon.

* * * * *